US011733607B2

(12) United States Patent
Ikenaga et al.

(10) Patent No.: US 11,733,607 B2
(45) Date of Patent: Aug. 22, 2023

(54) METAL PLATE FOR PRODUCING VAPOR DEPOSITION MASKS, INSPECTION METHOD FOR METAL PLATES, PRODUCTION METHOD FOR METAL PLATES, VAPOR DEPOSITION MASK, VAPOR DEPOSITION MASK DEVICE, AND PRODUCTION METHOD FOR VAPOR DEPOSITION MASKS

(71) Applicant: Dai Nippon Printing Co., Ltd., Tokyo (JP)

(72) Inventors: Chikao Ikenaga, Tokyo (JP); Hideyuki Okamoto, Tokyo (JP); Masato Ushikusa, Tokyo (JP); Chiaki Hatsuta, Tokyo (JP); Hiroki Oka, Tokyo (JP); Sachiyo Matsuura, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 312 days.

(21) Appl. No.: 16/580,524

(22) Filed: Sep. 24, 2019

(65) Prior Publication Data

US 2020/0019056 A1 Jan. 16, 2020

Related U.S. Application Data

(63) Continuation of application No. PCT/JP2018/041919, filed on Nov. 13, 2018.

(30) Foreign Application Priority Data

Nov. 14, 2017 (JP) ................................ 2017-219369
Dec. 26, 2017 (JP) ................................ 2017-249744
Jan. 11, 2018 (JP) ................................ 2018-002932

(51) Int. Cl.
*G03F 7/00* (2006.01)
*G03F 7/20* (2006.01)
(Continued)

(52) U.S. Cl.
CPC .............. *G03F 7/0035* (2013.01); *B21B 1/22* (2013.01); *C21D 6/001* (2013.01); *C21D 8/0247* (2013.01);
(Continued)

(58) Field of Classification Search
None
See application file for complete search history.

(56) References Cited

U.S. PATENT DOCUMENTS 4,363,846 A * 12/1982 Kaneki .................... G03F 1/50
118/504
5,130,203 A * 7/1992 Abe ........................ B05D 7/16
428/457
(Continued)

FOREIGN PATENT DOCUMENTS

CN 102692184 B 7/2014
CN 105004786 A 10/2015
(Continued)

OTHER PUBLICATIONS

International Search Report and Written Opinion (Application No. PCT/JP2018/041915) dated Feb. 5, 2019.
(Continued)

*Primary Examiner* — Jethro M. Pence
(74) *Attorney, Agent, or Firm* — Burr Patent Law, PLLC

(57) ABSTRACT

A metal plate includes a surface including a longitudinal direction of the metal plate and a width direction orthogonal to the longitudinal direction. A surface reflectance by regular reflection of a light is 8% or more and 25% or less. The surface reflectance is measured when the light is incident on the surface at an angle of 45°±0.2°. The light is in at least one plane orthogonal to the surface.

20 Claims, 16 Drawing Sheets

P1
N
P2
L11
L22
L21
L12
D2
64b
64a
D1
50

(51) Int. Cl.

| | |
|---|---|
| ***C23C 14/04*** | (2006.01) |
| ***B05C 21/00*** | (2006.01) |
| ***B21B 1/22*** | (2006.01) |
| ***C23C 14/24*** | (2006.01) |
| ***C25D 1/04*** | (2006.01) |
| ***C25D 3/56*** | (2006.01) |
| ***C22C 38/08*** | (2006.01) |
| ***C21D 6/00*** | (2006.01) |
| ***C21D 8/02*** | (2006.01) |
| ***H10K 71/00*** | (2023.01) |
| *H10K 50/11* | (2023.01) |
| *H10K 59/00* | (2023.01) |
| *H10K 71/16* | (2023.01) |

(52) U.S. Cl.

CPC ............ *C22C 38/08* (2013.01); *C23C 14/042* (2013.01); *C23C 14/24* (2013.01); *C25D 1/04* (2013.01); *C25D 3/562* (2013.01); *G03F 7/0015* (2013.01); *G03F 7/0027* (2013.01); *G03F 7/2008* (2013.01); *G03F 7/2022* (2013.01); *H10K 71/00* (2023.02); *H10K 50/11* (2023.02); *H10K 59/00* (2023.02); *H10K 71/166* (2023.02)

(56) References Cited

U.S. PATENT DOCUMENTS

| | | | |
|---|---|---|---|
| 6,559,583 B1 | 5/2003 | Kanayama et al. | |
| 2002/0006350 A1 | 1/2002 | Nishida et al. | |
| 2002/0017395 A1 | 2/2002 | Hirose et al. | |
| 2002/0039693 A1 | 4/2002 | Kurosaki | |
| 2009/0084683 A1 | 4/2009 | Campestrini et al. | |
| 2010/0080915 A1* | 4/2010 | Masuda ................ | C23C 14/042 427/282 |
| 2017/0141315 A1 | 5/2017 | Ikenaga | |
| 2017/0198383 A1 | 7/2017 | Chang et al. | |
| 2018/0023182 A1 | 1/2018 | Ikenaga et al. | |
| 2018/0038002 A1 | 2/2018 | Tamura et al. | |
| 2018/0065162 A1 | 3/2018 | Mikami et al. | |
| 2018/0066352 A1 | 3/2018 | Tamura et al. | |

FOREIGN PATENT DOCUMENTS

| | | |
|---|---|---|
| EP | 3 144 410 A1 | 3/2017 |
| EP | 3 257 964 A1 | 12/2017 |
| JP | S61-039344 A1 | 2/1986 |
| JP | S63-016525 A1 | 1/1988 |
| JP | H05-144384 A1 | 6/1993 |
| JP | H08-220778 A | 8/1996 |
| JP | H08-269742 A1 | 10/1996 |
| JP | H11-219986 A1 | 8/1999 |
| JP | 2001-234385 A1 | 8/2001 |
| JP | 2002-012998 A1 | 1/2002 |
| JP | 2002-194573 A1 | 7/2002 |
| JP | 2004-183023 A1 | 7/2004 |
| JP | 2004-185890 A1 | 7/2004 |
| JP | 2008-293841 A1 | 12/2008 |
| JP | 2010-214447 A1 | 9/2010 |
| JP | 2010-247500 A1 | 11/2010 |
| JP | 5382259 B2 | 1/2014 |
| JP | 2014-148743 A1 | 8/2014 |
| JP | 2015-098650 A1 | 5/2015 |
| JP | 2015-168847 A1 | 9/2015 |
| JP | 2015-168884 A1 | 9/2015 |
| JP | 2016-108643 A1 | 6/2016 |
| JP | 2016-121376 A1 | 7/2016 |
| JP | 2016-135505 A1 | 7/2016 |
| JP | 2017-064763 A1 | 4/2017 |
| JP | 2017-066530 A1 | 4/2017 |
| JP | 2017-088914 A1 | 5/2017 |
| JP | 2017-088915 A1 | 5/2017 |
| JP | 2017-101302 A1 | 6/2017 |
| JP | 2017-106114 A1 | 6/2017 |
| JP | 2017-125253 A1 | 7/2017 |
| JP | 2017-141500 A1 | 8/2017 |
| JP | 2017-166029 A | 9/2017 |
| JP | 2018-040055 A1 | 3/2018 |
| WO | 2015/174269 A1 | 11/2015 |
| WO | 2016/129533 A1 | 8/2016 |
| WO | 2017/013904 A1 | 1/2017 |
| WO | 2017/014016 A1 | 1/2017 |
| WO | 2017/014172 A1 | 1/2017 |
| WO | 2018/043641 A1 | 3/2018 |
| WO | 2018/043642 A1 | 3/2018 |
| WO | 2018/235862 A1 | 12/2018 |

OTHER PUBLICATIONS

International Search Report and Written Opinion (Application No. PCT/JP2018/041918) dated Feb. 12, 2019.

International Search Report and Written Opinion (Application No. PCT/JP2018/041919) dated Feb. 12, 2019.

Japanese Office Action (Application No. 2018-563643) dated Feb. 1, 2019 (with English translation).

Japanese Office Action (Application No. 2018-563643) dated Mar. 29, 2019 (with English translation).

Extended European Search Report (Application No. 19208503.3) dated Feb. 11, 2020.

U.S. Appl. No. 16/578,291, filed Sep. 21, 2019, Hiroki Oka.

U.S. Appl. No. 16/580,401, filed Sep. 24, 2019, Chikao Ikenaga.

U.S. Appl. No. 16/680,942, filed Nov. 12, 2019, Hiroki Oka.

Chinese Office Action (Application No. 201811344277.0) dated Jul. 16, 2020 (with English translation).

Partial Supplementary European Search Report (Application No. 18879902.7) dated Aug. 17, 2021.

U.S. Office Action (U.S. Appl. No. 16/680,942) dated Nov. 10, 2021.

Japanese Office Action (Application No. 2021-133631) dated Sep. 10, 2021 (with English translation).

E112-13, ASTM International, "*Standard Test Methods for Determining Average Grain Size*," (Feb. 2014).

Tanikawa, Keiichi, "*Surface Chemistry of Cold Rolling Oil*," vol. 10, Issue 7, pp. 448-455 (Mar. 13, 1989).

Ryde, L., "*Application of EBSD to Analysis of Microstructures in Commercial Steels*," Materials Science and Technology 22.11 (2006): 1297-1306 (Year: 2006).

U.S. Office Action (U.S. Appl. No. 16/680,942) dated Jan. 5, 2023.

U.S. Office Action, U.S. Appl. No. 17/168,496, dated Sep. 30, 2022 (21 pages).

Japanese Office Action (Application No. 2021-133631) dated Jan. 28, 2022 (with English translation).

U.S. Office Action, U.S. Appl. No. 16/680,942, dated Jul. 28, 2022 (16 pages).

JIS G 0551:2013, Japanese Standards Association (2013) (54 pages).

Taiwanese Office Action (with English translation) dated Jan. 4, 2023 (Application No. 108141150).

Partial Supplementary European Search Report (Application No. 18879719.5) dated Oct. 1, 2021.

U.S. Office Action dated Apr. 6, 2023 (U.S. Appl. No. 17/168,496).

* cited by examiner

| | THICK-NESS [μm] | MEASURE-MENT POSITION | 1ST REFLECTANCE [%] | 2ND REFLECTANCE [%] | AVERAGE [%] | 1ST REFLECTANCE /2ND REFLECTANCE | EVAL. A | EVAL. B | EVAL. C | EVAL. D | OVERALL EVAL. |
|---|---|---|---|---|---|---|---|---|---|---|---|
| EXAMPLE 1 | 15 | L | 22.7 | 23.6 | 23.1 | 0.96 | OK | OK | NG | OK | good |
| | | M | 23.0 | 23.6 | | 0.98 | | | | | |
| | | R | 23.1 | 22.6 | | 1.02 | | | | | |
| EXAMPLE 2 | 15 | L | 36.5 | 36.6 | 36.0 | 1.00 | OK | NG | NG | OK | not good |
| | | M | 35.8 | 35.8 | | 1.00 | | | | | |
| | | R | 35.6 | 35.7 | | 1.00 | | | | | |
| EXAMPLE 3 | 18 | L | 7.5 | 7.5 | 7.5 | 1.00 | NG | OK | OK | OK | not good |
| | | M | 7.5 | 7.5 | | 1.00 | | | | | |
| | | R | 7.5 | 7.5 | | 1.00 | | | | | |
| EXAMPLE 4 | 18 | L | 9.0 | 9.5 | 9.3 | 0.95 | OK | OK | OK | OK | great |
| | | M | 8.8 | 9.5 | | 0.93 | | | | | |
| | | R | 9.5 | 9.5 | | 1.00 | | | | | |
| EXAMPLE 5 | 18 | L | 21.9 | 22.3 | 20.5 | 0.99 | OK | OK | NG | OK | good |
| | | M | 20.4 | 20.7 | | 0.99 | | | | | |
| | | R | 18.8 | 18.8 | | 1.00 | | | | | |
| EXAMPLE 6 | 18 | L | 37.0 | 37.1 | 36.8 | 1.00 | OK | NG | NG | OK | not good |
| | | M | 36.9 | 37.3 | | 0.99 | | | | | |
| | | R | 36.0 | 36.5 | | 0.99 | | | | | |
| EXAMPLE 7 | 20 | L | 7.0 | 7.7 | 7.5 | 0.91 | NG | OK | OK | OK | not good |
| | | M | 7.2 | 7.8 | | 0.92 | | | | | |
| | | R | 7.2 | 7.9 | | 0.91 | | | | | |
| EXAMPLE 8 | 20 | L | 8.3 | 8.7 | 8.5 | 0.95 | OK | OK | OK | OK | great |
| | | M | 8.2 | 8.8 | | 0.93 | | | | | |
| | | R | 8.2 | 8.8 | | 0.93 | | | | | |
| EXAMPLE 9 | 20 | L | 11.8 | 12.1 | 11.6 | 0.98 | OK | OK | OK | OK | great |
| | | M | 11.7 | 11.6 | | 1.01 | | | | | |
| | | R | 11.3 | 11.3 | | 0.99 | | | | | |
| EXAMPLE 10 | 20 | L | 23.9 | 24.7 | 24.5 | 0.97 | OK | OK | NG | OK | good |
| | | M | 24.4 | 24.8 | | 0.98 | | | | | |
| | | R | 24.2 | 24.9 | | 0.97 | | | | | |
| EXAMPLE 11 | 20 | L | 29.6 | 29.9 | 29.2 | 0.99 | OK | NG | NG | OK | not good |
| | | M | 28.9 | 28.8 | | 1.00 | | | | | |
| | | R | 29.1 | 29.1 | | 1.00 | | | | | |
| EXAMPLE 12 | 20 | L | 41.7 | 42.5 | 42.1 | 0.98 | OK | NG | NG | OK | not good |
| | | M | 41.6 | 42.0 | | 0.99 | | | | | |
| | | R | 42.0 | 42.7 | | 0.98 | | | | | |

FIG. 18A

| | THICK-NESS [μm] | MEASURE-MENT POSITION | 1ST REFLECTANCE [%] | 2ND REFLECTANCE [%] | AVERAGE [%] | 1ST REFLECTANCE/2ND REFLECTANCE | EVAL. A | EVAL. B | EVAL. C | EVAL. D | OVERALL EVAL. |
|---|---|---|---|---|---|---|---|---|---|---|---|
| EXAMPLE 13 | 25 | L | 7.8 | 7.8 | 7.8 | 1.00 | NG | OK | OK | OK | not good |
| | | M | 7.8 | 7.8 | | 1.00 | | | | | |
| | | R | 7.8 | 7.8 | | 1.00 | | | | | |
| EXAMPLE 14 | 25 | L | 8.2 | 8.2 | 8.0 | 1.00 | OK | OK | OK | OK | great |
| | | M | 8.1 | 8.1 | | 1.00 | | | | | |
| | | R | 7.5 | 8.1 | | 0.93 | | | | | |
| EXAMPLE 15 | 25 | L | 18.0 | 16.2 | 18.1 | 1.11 | OK | OK | OK | OK | great |
| | | M | 18.1 | 18.3 | | 0.99 | | | | | |
| | | R | 18.9 | 19.1 | | 0.99 | | | | | |
| EXAMPLE 16 | 25 | L | 39.9 | 40.8 | 40.5 | 0.98 | NG | NG | NG | OK | not good |
| | | M | 40.8 | 41.4 | | 0.99 | | | | | |
| | | R | 40.3 | 39.8 | | 1.01 | | | | | |
| EXAMPLE 17 | 30 | L | 18.2 | 18.4 | 17.5 | 0.99 | OK | OK | OK | OK | great |
| | | M | 17.2 | 17.2 | | 1.00 | | | | | |
| | | R | 16.9 | 16.9 | | 1.00 | | | | | |
| EXAMPLE 18 | 30 | L | 39.1 | 39.5 | 37.9 | 0.99 | OK | NG | NG | OK | not good |
| | | M | 38.2 | 38.5 | | 0.99 | | | | | |
| | | R | 36.0 | 36.0 | | 1.00 | | | | | |
| EXAMPLE 19 | 35 | L | 18.7 | 18.8 | 18.4 | 0.99 | OK | OK | OK | OK | great |
| | | M | 18.6 | 18.6 | | 1.00 | | | | | |
| | | R | 17.8 | 17.9 | | 0.99 | | | | | |
| EXAMPLE 20 | 35 | L | 35.2 | 33.4 | 35.5 | 1.06 | OK | NG | NG | OK | not good |
| | | M | 35.9 | 36.1 | | 0.99 | | | | | |
| | | R | 36.1 | 36.3 | | 0.99 | | | | | |
| EXAMPLE 21 | 40 | L | 19.8 | 19.9 | 19.4 | 0.99 | OK | OK | OK | OK | great |
| | | M | 19.1 | 19.5 | | 0.98 | | | | | |
| | | R | 18.8 | 19.3 | | 0.97 | | | | | |
| EXAMPLE 22 | 40 | L | 32.0 | 32.0 | 31.6 | 1.00 | OK | NG | NG | OK | not good |
| | | M | 31.3 | 31.3 | | 1.00 | | | | | |
| | | R | 31.3 | 31.9 | | 0.98 | | | | | |
| EXAMPLE 23 | 100 | L | 12.7 | 12.9 | 12.7 | 0.98 | OK | OK | OK | OK | great |
| | | M | 13.0 | 13.0 | | 1.00 | | | | | |
| | | R | 12.1 | 12.3 | | 0.99 | | | | | |
| EXAMPLE 24 | 100 | L | 35.4 | 35.6 | 34.9 | 1.00 | OK | NG | NG | OK | not good |
| | | M | 35.0 | 35.0 | | 1.00 | | | | | |
| | | R | 34.1 | 34.1 | | 1.00 | | | | | |

FIG. 18B

| | THICK-NESS [μm] | MEASURE-MENT POSITION | 1ST REFLECTANCE [%] | 2ND REFLECTANCE [%] | AVERAGE [%] | 1ST REFLECTANCE/2ND REFLECTANCE | EVAL. A | EVAL. B | EVAL. C | EVAL. D | OVERALL EVAL. |
|---|---|---|---|---|---|---|---|---|---|---|---|
| EXAMPLE 25 | 15 | L | 19.6 | 8.1 | 13.8 | 2.42 | OK | OK | OK | NG | not good |
| | | M | 19.1 | 8.0 | | 2.39 | | | | | |
| | | R | 19.3 | 8.4 | | 2.30 | | | | | |
| EXAMPLE 26 | 18 | L | 24.4 | 13.1 | 18.7 | 1.86 | OK | OK | NG | NG | not good |
| | | M | 23.9 | 13.2 | | 1.81 | | | | | |
| | | R | 23.7 | 13.6 | | 1.74 | | | | | |
| EXAMPLE 27 | 20 | L | 16.1 | 8.1 | 12.1 | 1.99 | OK | OK | OK | NG | not good |
| | | M | 15.9 | 8.0 | | 1.99 | | | | | |
| | | R | 16.2 | 8.0 | | 2.01 | | | | | |
| EXAMPLE 28 | 20 | L | 19.4 | 15.0 | 17.2 | 1.29 | OK | OK | OK | OK | great |
| | | M | 19.3 | 15.1 | | 1.28 | | | | | |
| | | R | 19.3 | 14.9 | | 1.30 | | | | | |
| EXAMPLE 29 | 20 | L | 32.2 | 17.6 | 24.9 | 1.83 | OK | NG | NG | NG | not good |
| | | M | 32.1 | 17.8 | | 1.80 | | | | | |
| | | R | 32.2 | 17.4 | | 1.85 | | | | | |
| EXAMPLE 30 | 25 | L | 13.4 | 19.2 | 16.5 | 0.70 | OK | OK | OK | NG | not good |
| | | M | 13.5 | 19.6 | | 0.69 | | | | | |
| | | R | 13.6 | 19.5 | | 0.70 | | | | | |
| EXAMPLE 31 | 30 | L | 10.2 | 16.0 | 12.8 | 0.64 | OK | OK | OK | NG | not good |
| | | M | 10.4 | 15.3 | | 0.68 | | | | | |
| | | R | 10.1 | 14.6 | | 0.69 | | | | | |
| EXAMPLE 32 | 35 | L | 24.3 | 18.6 | 21.5 | 1.31 | OK | OK | NG | NG | not good |
| | | M | 24.4 | 18.5 | | 1.32 | | | | | |
| | | R | 24.5 | 18.6 | | 1.32 | | | | | |
| EXAMPLE 33 | 40 | L | 12.2 | 18.9 | 15.5 | 0.65 | OK | OK | OK | NG | not good |
| | | M | 12.3 | 18.6 | | 0.66 | | | | | |
| | | R | 12.6 | 18.2 | | 0.69 | | | | | |
| EXAMPLE 34 | 50 | L | 19.1 | 14.8 | 17.0 | 1.29 | OK | OK | OK | OK | great |
| | | M | 19.2 | 14.9 | | 1.29 | | | | | |
| | | R | 19.2 | 14.8 | | 1.30 | | | | | |
| EXAMPLE 35 | 100 | L | 16.2 | 12.0 | 14.0 | 1.35 | OK | OK | OK | NG | not good |
| | | M | 16.3 | 11.7 | | 1.39 | | | | | |
| | | R | 16.2 | 11.4 | | 1.43 | | | | | |

FIG. 18C

| | THICK-NESS [μm] | 1ST REFLECTANCE [%] | 2ND REFLECTANCE [%] | AVERAGE [%] | 1ST REFLECTANCE /2ND REFLECTANCE | EVAL. A | EVAL. B | EVAL. C | EVAL. D | OVERALL EVAL. |
|---|---|---|---|---|---|---|---|---|---|---|
| EXAMPLE 7 | 20 | 7.1 | 7.8 | 7.5 | 0.92 | NG | OK | OK | OK | not good |
| EXAMPLE 3 | 18 | 7.5 | 7.5 | 7.5 | 1.00 | NG | OK | OK | OK | not good |
| EXAMPLE 13 | 25 | 7.8 | 7.8 | 7.8 | 1.00 | NG | OK | OK | OK | not good |
| EXAMPLE 14 | 25 | 7.9 | 8.1 | 8.0 | 0.98 | OK | OK | OK | OK | great |
| EXAMPLE 8 | 20 | 8.2 | 8.8 | 8.5 | 0.94 | OK | OK | OK | OK | great |
| EXAMPLE 4 | 18 | 9.1 | 9.5 | 9.3 | 0.96 | OK | OK | OK | OK | great |
| EXAMPLE 9 | 20 | 11.6 | 11.7 | 11.6 | 0.99 | OK | OK | OK | OK | great |
| EXAMPLE 27 | 20 | 16.1 | 8.0 | 12.1 | 2.00 | OK | OK | OK | NG | not good |
| EXAMPLE 23 | 100 | 12.6 | 12.7 | 12.7 | 0.99 | OK | OK | OK | OK | great |
| EXAMPLE 31 | 30 | 10.2 | 15.3 | 12.8 | 0.67 | OK | OK | OK | NG | not good |
| EXAMPLE 25 | 15 | 19.3 | 8.2 | 13.8 | 2.37 | OK | OK | OK | NG | not good |
| EXAMPLE 35 | 100 | 16.2 | 11.7 | 14.0 | 1.39 | OK | OK | OK | NG | not good |
| EXAMPLE 33 | 40 | 12.4 | 18.6 | 15.5 | 0.67 | OK | OK | OK | NG | not good |
| EXAMPLE 30 | 25 | 13.5 | 19.4 | 16.5 | 0.69 | OK | OK | OK | NG | not good |
| EXAMPLE 34 | 50 | 19.2 | 14.8 | 17.0 | 1.29 | OK | OK | OK | OK | great |
| EXAMPLE 28 | 20 | 19.3 | 15.0 | 17.2 | 1.29 | OK | OK | OK | OK | great |
| EXAMPLE 17 | 30 | 17.5 | 17.5 | 17.5 | 1.00 | OK | OK | OK | OK | great |
| EXAMPLE 15 | 25 | 18.3 | 17.9 | 18.1 | 1.03 | OK | OK | OK | OK | great |
| EXAMPLE 19 | 35 | 18.4 | 18.5 | 18.4 | 1.00 | OK | OK | OK | OK | great |
| EXAMPLE 26 | 18 | 24.0 | 13.3 | 18.7 | 1.81 | OK | OK | NG | NG | not good |
| EXAMPLE 21 | 40 | 19.2 | 19.6 | 19.4 | 0.98 | OK | OK | OK | OK | great |
| EXAMPLE 5 | 18 | 20.4 | 20.6 | 20.5 | 0.99 | OK | OK | NG | OK | good |
| EXAMPLE 32 | 35 | 24.4 | 18.6 | 21.5 | 1.31 | OK | OK | NG | NG | not good |
| EXAMPLE 1 | 15 | 22.9 | 23.3 | 23.1 | 0.99 | OK | OK | NG | OK | good |
| EXAMPLE 10 | 20 | 24.2 | 24.8 | 24.5 | 0.97 | OK | OK | NG | OK | good |
| EXAMPLE 29 | 20 | 32.2 | 17.6 | 24.9 | 1.83 | OK | NG | NG | NG | not good |
| EXAMPLE 11 | 20 | 29.2 | 29.3 | 29.2 | 1.00 | OK | NG | NG | OK | not good |
| EXAMPLE 22 | 40 | 31.5 | 31.7 | 31.6 | 0.99 | OK | NG | NG | OK | not good |
| EXAMPLE 24 | 100 | 34.9 | 34.9 | 34.9 | 1.00 | OK | NG | NG | OK | not good |
| EXAMPLE 20 | 35 | 35.7 | 35.3 | 35.5 | 1.01 | OK | NG | NG | OK | not good |
| EXAMPLE 2 | 15 | 36.0 | 36.1 | 36.0 | 1.00 | OK | NG | NG | OK | not good |
| EXAMPLE 6 | 18 | 36.6 | 37.0 | 36.8 | 0.99 | OK | NG | NG | OK | not good |
| EXAMPLE 18 | 30 | 37.8 | 38.0 | 37.9 | 0.99 | OK | NG | NG | OK | not good |
| EXAMPLE 16 | 25 | 40.3 | 40.7 | 40.5 | 0.99 | NG | NG | NG | OK | not good |
| EXAMPLE 12 | 20 | 41.8 | 42.4 | 42.1 | 0.99 | OK | NG | NG | OK | not good |

FIG. 19

METAL PLATE FOR PRODUCING VAPOR DEPOSITION MASKS, INSPECTION METHOD FOR METAL PLATES, PRODUCTION METHOD FOR METAL PLATES, VAPOR DEPOSITION MASK, VAPOR DEPOSITION MASK DEVICE, AND PRODUCTION METHOD FOR VAPOR DEPOSITION MASKS

CROSS-REFERENCE TO RELATED APPLICATIONS

This application is a continuation application of International Application No. PCT/JP2018/41919, filed on Nov. 13, 2018, which claims the benefit of priority from Japanese Patent Application No. 2017-219369, filed on Nov. 14, 2017, Japanese Patent Application No. 2017-249744, filed on Dec. 26, 2017 and Japanese Patent Application No. 2018-2932, filed on Jan. 11, 2018. The entire contents of these applications are incorporated herein by reference.

BACKGROUND

Field

Embodiments of the present disclosure relate to a metal plate for manufacturing a deposition mask, an inspection method for a metal plate, and a manufacturing method for a metal plate. In addition, embodiments of the present disclosure relate to a deposition mask, a deposition mask apparatus, and a manufacturing method for a deposition mask.

Background Art

A display device used in a portable device such as a smart phone and a tablet PC is required to have high fineness, e.g., a pixel density of 500 ppi or more. In addition, there is increasing demand that the portable device is applicable in the ultra high-definitions (UHD) reference. In this case, the pixel density of the display device needs to be 800 ppi or more, for example.

An organic EL display device draws attention because of its excellent responsivity and low power consumption. A known method for forming pixels of an organic EL display device is a method which uses a deposition mask including through-holes that are arranged in a desired pattern, and forms pixels in the desired pattern. To be specific, a deposition mask is firstly brought into tight contact with a substrate for organic EL display device, and then the substrate and the deposition mask in tight contact therewith are put into a deposition apparatus so as to deposit an organic material and so on.

One known method for manufacturing a deposition mask includes forming through-holes in a metal plate by etching using photolithographic technique. For example, a first resist pattern is firstly formed on a first surface of the metal plate, and a second resist pattern is formed on a second surface of the metal plate. Then, an area of the second surface of the metal plate, which is not covered with the second resist pattern, is etched to form second recesses in the second surface of the metal plate. Thereafter, an area of the first surface of the metal plate, which is not covered with the first resist pattern, is etched to form first recesses in the first surface of the metal plate. At this time, by etching the areas such that each first recess and each second recess communicate with each other, through-holes passing through the metal plate can be formed.

Another known method for manufacturing a deposition mask is utilizing a plating process to produce a deposition mask. For example, the method begins with preparing an electrically conductive base material. Next, resist patterns are formed on the base material with a certain clearance created therebetween. The resist patterns are disposed at positions where through-holes for a deposition mask are to be made. Then, a plating liquid is supplied into the clearance between the resist patterns and an electrolytic plating process is carried out so that a metal layer is deposited on the base material. Then, the metal layer is separated from the base material, thereby providing a deposition mask having a plurality of through-holes formed therein.

PRIOR ART

Patent Document

Patent Document 1: Japanese Patent No. 5382259
Patent Document 2: JP2001-234385A

SUMMARY

As a pixel density of an organic EL display device increases, a size and an arrangement pitch of through-holes of a deposition mask decrease. When through-holes are formed in a metal plate by etching using the photolithographic technique, a width of resist pattern provided on a first surface or a second surface of the metal plate narrows. To make narrower the resist pattern width means that a contact area between the resist pattern and the metal plate is reduced. Thus, it is required for the resist film for forming a resist pattern to have a high adhesion force to the metal plate.

Embodiments of the present disclosure have been made in view of the above circumstances, and an object thereof is to provide a metal plate on which a resist pattern of a narrow width can be stably disposed. In addition, embodiments of the present disclosure relate to an inspection method and a manufacturing method for a metal plate, and to a deposition mask, a deposition mask apparatus, and a manufacturing method for a deposition mask.

According to a first aspect of the present disclosure, there is provided a metal plate used for manufacturing a deposition mask includes a surface including a longitudinal direction of the metal plate and a width direction orthogonal to the longitudinal direction, wherein a surface reflectance by regular reflection of a light is 8% or more and 25% or less, the surface reflectance being measured when the light is incident on the surface at an incident angle of 45°±0.2°, the light being in at least one plane orthogonal to the surface.

According to a second aspect of the disclosure, in the metal plate according to the aforementioned first aspect, the surface reflectance may be 8% or more and 20% or less.

According to a third aspect of the disclosure, in the metal plate according to the aforementioned first or second aspect, an average of a first reflectance and a second reflectance is 8% or more and 25% or less, the first reflectance is a surface reflectance by regular reflection of a light, the first reflectance being measured when the light is incident on the surface at an incident angle of 45°±0.2°, the light being in a first plane orthogonal to the surface and to the longitudinal direction, and the second reflectance is a surface reflectance by regular reflection of a light, the second reflectance being measured when the light is incident on the surface at an incident angle of 45°±0.2°, the light being in a second plane orthogonal to the surface and to the width direction.

According to a fourth aspect of the disclosure, in the metal plate according to the aforementioned third aspect, an average of the first reflectance and the second reflectance may be 8% or more and 20% or less.

According to a fifth aspect of the disclosure, in the metal plate according to the aforementioned third or fourth aspect, the metal plate may include a first area, a second area, and a third area arranged from one end to the other end of the metal plate with respect to the width direction, the first area, the second area, and the third area each having the same length along the width direction, and each of the first reflectance and the second reflectance may be an average of the reflectances measured within the first area, the second area, and the third area.

According to a sixth aspect of the disclosure, in the metal plate according to the aforementioned third to fifth aspects, a value obtained by dividing the first reflectance by the second reflectance may be 0.70 or more and 1.30 or less.

According to a seventh aspect of the disclosure, in the metal plate according to the aforementioned first to sixth aspects, a thickness of the metal plate may be equal to or less than 100 μm.

According to a eighth aspect of the disclosure, in the metal plate according to the aforementioned first to seventh aspects, the metal plate may be made of an iron alloy containing nickel.

According to a ninth aspect of the disclosure, in the metal plate according to the aforementioned first to eighth aspects, the surface of the metal plate may include a plurality of rolling streaks extending in the longitudinal direction. The surface of the metal plate according to an embodiment of the present disclosure may include a plurality of oil pits having a direction orthogonal to the longitudinal direction.

According to a tenth aspect of the disclosure, in the metal plate according to the aforementioned first to ninth aspects, the metal plate may be for manufacturing the deposition mask which is obtained by exposing and developing a resist film attached to the surface of the metal plate to form a first resist pattern, and etching a region of the surface of the metal plate, the region being not covered with the first resist pattern. For example, according to a eleventh aspect of the disclosure, in the metal plate according to the aforementioned tenth aspect, the metal plate may be for manufacturing the deposition mask which is obtained by exposing and developing a resist film attached to the surface of the metal plate under an environment at equal to or less than 1,000 Pa to form a first resist pattern, and etching a region of the surface of the metal plate, the region being not covered with the first resist pattern.

According to a twelfth aspect of the disclosure, in the metal plate according to the aforementioned first to eleventh aspects, the surface reflectance may be calculated as a percentage relative to an intensity measured when the light is directly entered a detector.

According to a thirteenth aspect of the disclosure, in the metal plate according to the aforementioned first to twelfth aspects, the surface reflectance may be a first surface reflectance that is based on a reflected light observed when the light is incident on a first surface of the metal plate, the first surface constituting a surface of the deposition mask on an organic EL substrate's side.

According to a fourteenth aspect of the disclosure, there is provided a method for inspecting a metal plate used for manufacturing a deposition mask, wherein the metal plate includes a surface having a longitudinal direction of the metal plate and a width direction orthogonal to the longitudinal direction, and wherein the method includes: a measuring step of measuring a surface reflectance of a reflected light observed when the light is incident on the surface; and a determining step of determining the metal plate to be good when the surface reflectance is 8% or more and 25% or less, the surface reflectance being measured based on the reflected light on the surface at an angle of 45°±0.2° in at least one plane orthogonal to the surface.

According to a fifteenth aspect of the disclosure, there is provided a method for manufacturing a metal plate used for manufacturing a deposition mask, the method including: a production step of obtaining the metal plate by a rolling process or a plating process, wherein the metal plate includes a surface including a longitudinal direction of the metal plate and a width direction orthogonal to the longitudinal direction, and wherein a surface reflectance of a reflected light observed when a light is incident on the surface of the metal plate is 8% or more and 25% or less, the surface reflectance being measured based on the reflected light on the surface at an angle of 45°±0.2° in at least one plane orthogonal to the surface.

According to a sixteenth aspect of the disclosure, in the method for manufacturing the metal plate according to the aforementioned fifteenth aspect, the method may include a screening step of sorting out the metal plate that has the surface reflectance 8% or more and 25% or less.

According to a seventeenth aspect of the disclosure, there is provided a deposition mask including: a metal plate; and a plurality of through-holes formed in the metal plate, wherein a surface reflectance of a reflected light observed when a light is incident on a surface of the metal plate is 8% or more and 25% or less, the surface reflectance being measured based on the reflected light on the surface at an angle of 45°±0.2° in at least one plane orthogonal to the surface.

According to a eighteenth aspect of the disclosure, there is provided a deposition mask apparatus including: a deposition mask including a metal plate and a plurality of through-holes formed in the metal plate; and a frame supporting the deposition mask, wherein a surface reflectance of a reflected light observed when a light is incident on a surface of the metal plate is 8% or more and 25% or less, the surface reflectance being measured based on the reflected light on the surface at an angle of 45°±0.2° in at least one plane orthogonal to the surface.

According to a nineteenth aspect of the disclosure, there is provided a method for manufacturing a deposition mask including a plurality of through-holes formed in the deposition mask, the method including: a step of preparing a metal plate; a resist film forming step of disposing a resist film on a surface of the metal plate; a step of processing the resist film to form a resist pattern; and a step of etching the metal plate with the resist pattern serving as a mask, wherein a surface reflectance of a reflected light observed when a light is incident on a surface of the metal plate is 8% or more and 25% or less, the surface reflectance being measured based on the reflected light on the surface at an angle of 45°±0.2° in at least one plane orthogonal to the surface.

According to a twentieth aspect of the disclosure, in the method for manufacturing a deposition mask according to the aforementioned nineteenth aspect, the resist film forming step may include a step of attaching the resist film to the surface of the metal plate under an environment at equal to or less than 1,000 Pa.

According to an embodiment of the present disclosure, a deposition mask can be obtained stably.

BRIEF DESCRIPTION OF THE DRAWINGS

FIG. 18A shows results of evaluations conducted on metal plates according to Examples 1 to 12.

FIG. 18B shows results of evaluations conducted on metal plates according to Examples 13 to 24.

FIG. 18C shows results of evaluations conducted on metal plates according to Examples 25 to 35.

FIG. 19 shows results of evaluations conducted on metal plates according to Examples 1 to 35.

DESCRIPTION OF EMBODIMENTS

Figure 1:
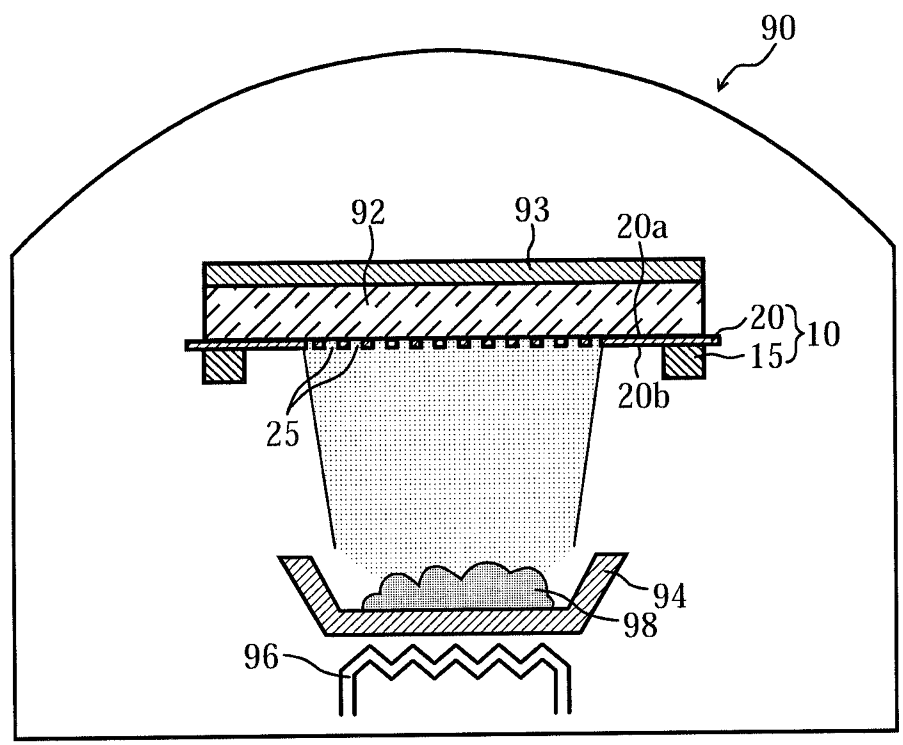
FIG. 1 is a view showing a deposition apparatus including a deposition mask apparatus according to an embodiment of the present disclosure.

An embodiment of the present disclosure will now be described with reference to the drawings. In the drawings attached to the specification, a scale dimension, an aspect ratio and so on are changed and exaggerated from the actual ones, for the convenience of easiness in illustration and understanding.

Embodiments of the present disclosure may be combined with other embodiments and modification examples to the extent that no contradiction arises. Other embodiments may also be combined with one another and with modification examples to the extent that no contradiction arises. Modification examples may also be combined with one another to the extent that no contradiction arises.

In embodiments of the present disclosure, any non-disclosed step may be carried out between a plurality of steps as disclosed in connection with a manufacturing method or any other method. The disclosed steps may be carried out in any order to the extent that no contradiction arises.

FIGS. 1 to 17B are views for explaining an embodiment of the present disclosure. By way of example, the following embodiments and modification examples describe a manufacturing method for a deposition mask that is used for patterning an organic material in a desired pattern on a substrate when an organic EL display apparatus is manufactured. However, the present disclosure is not limited thereto but can be applied to deposition masks used for various applications.

In this specification, the terms “plate”, “sheet” and “film” are not differentiated from one another based only on the difference of terms. For example, the “plate” is a concept including a member that can be referred to as sheet or film.

In addition, the term “plate plane (sheet plane, film plane)” means a plane corresponding to a plane direction of a plate-like (sheet-like, film-like) member as a target, when the plate-like (sheet-like, film-like) member as a target is seen as a whole in general. A normal direction used to the plate-like (sheet-like, film-like) member means a normal direction with respect to a plate plane (sheet surface, film surface) of the member.

Further, in this specification, terms specifying shapes, geometric conditions and their degrees, e.g., “parallel”, “perpendicular”, “same”, “similar” etc., are not limited to their strict definitions, but construed to include a range capable of exerting a similar function.

First, a deposition apparatus 90 for performing a deposition process of depositing a deposition material on a target is described with reference to FIG. 1. As illustrated in FIG. 1, the deposition apparatus 90 may contain a deposition source (e.g., a crucible 94), a heater 96, and a deposition mask apparatus 10. The deposition apparatus 90 may further include air evacuating means for creating a vacuum atmosphere inside the deposition apparatus 90. The crucible 94 holds a deposition material 98 such as an organic luminescent material. The heater 96 heats the crucible 94 to evaporate the deposition material 98 under a vacuum atmosphere. The deposition mask apparatus 10 is placed so as to face the crucible 94.

The following describes the deposition mask apparatus 10. As illustrated in FIG. 1, the deposition mask apparatus 10 may include a deposition mask 20 and a frame 15 supporting the deposition mask 20. The frame 15 supports the deposition mask 20 being stretched along the surface direction thereof so as to prevent the deposition mask 20 from warping. As shown in FIG. 1, the deposition mask apparatus 10 is placed inside the deposition apparatus 90 such that the deposition mask 20 faces a target substrate, e.g., an organic EL substrate 92, to which the deposition material 98 is to adhere. In the description below, the surface of the deposition mask 20 on the organic EL substrate 92 side is referred to as a first surface **20*a* while the surface opposite to the first surface 20*a* is referred to as a second surface 20*b***.

As shown in FIG. 1, the deposition mask apparatus 10 may include a magnet 93 placed on a surface of the organic EL substrate 92, the surface being opposite to the deposition mask 20. Disposing the magnet 93 allows the deposition mask 20 to be attracted toward the magnet 93 by a magnetic force, so that the deposition mask 20 adheres to the organic EL substrate 92. Alternatively, an electrostatic chuck based on an electrostatic force (Coulomb force) may be used to cause the deposition mask 20 to adhere to the organic EL substrate 92.

Figure 3:
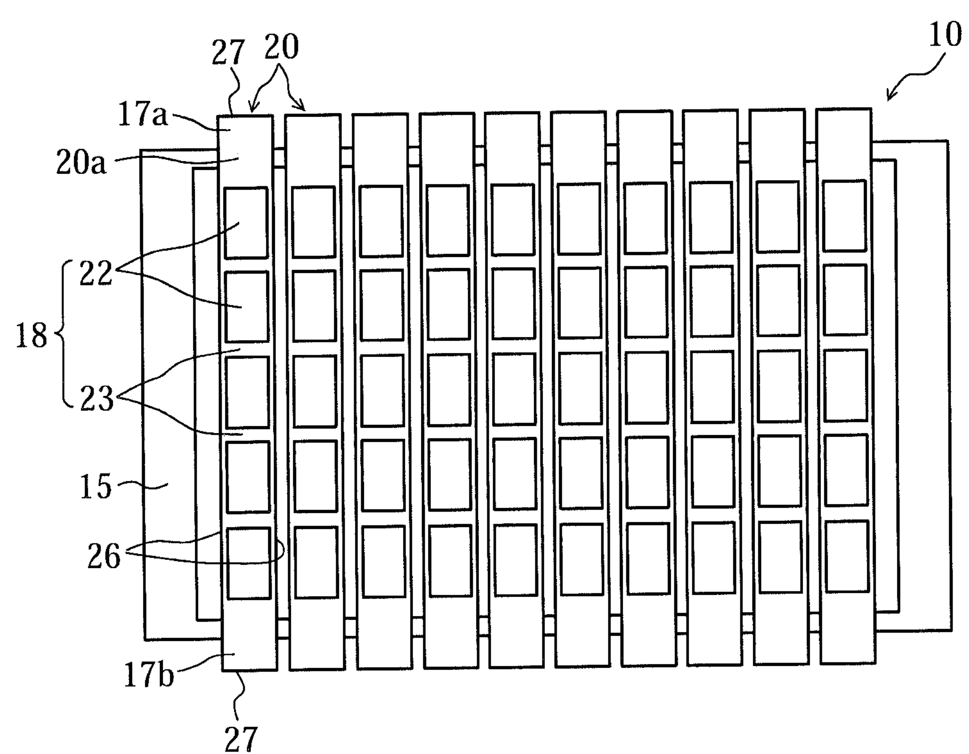
FIG. 3 is a plan view of the deposition mask apparatus according to an embodiment of the present disclosure.

FIG. 3 is a plan view of the deposition mask apparatus 10 as seen from the first surface 20*a* side of the deposition mask 20. As illustrated in FIG. 3, the deposition mask apparatus 10 may include a plurality of the deposition masks 20. Each deposition mask 20 may include a pair of longer sides 26 and a pair of shorter sides 27. For example, each deposition mask 20 may be in a rectangular shape. Each deposition mask 20 may be fixed to the frame 15 through, for example, welding at or near the pair of shorter sides 27.

The deposition mask 20 may include a metal plate having a plurality of through-holes 25 formed to pass through the deposition mask 20. The evaporated deposition material 98 reaching the deposition mask apparatus 10 from the crucible 94 passes through the through-holes 25 in the deposition masks 20 and adheres to the organic EL substrate 92. As a result, a film of the deposition material 98 can be formed on the surface of the organic EL substrate 92 in a desired pattern corresponding to the positions of the through-holes 25 in the deposition mask 20.

Figure 2:
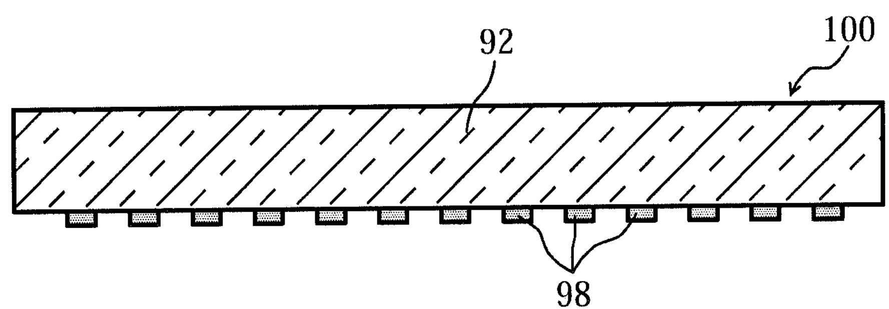
FIG. 2 is a sectional view of an organic EL display apparatus manufactured by using the deposition mask apparatus shown in FIG. 1.

FIG. 2 is a sectional view of an organic EL display apparatus 100 manufactured by using the deposition apparatus 90 in FIG. 1. The organic EL display apparatus 100 includes the organic EL substrate 92 and pixels including the deposition material 98 disposed in a pattern.

In order to display in different colors, the individual deposition apparatuses 90 including the deposition masks 20 corresponding to the respective colors are prepared, and the organic EL substrate 92 is put into the individual deposition apparatuses 90 sequentially. In this way, for example, an organic luminescent material for red color, an organic luminescent material for green color, and an organic luminescent material for blue color can be sequentially deposited on the organic EL substrate 92.

Note that the deposition process may be performed inside the deposition apparatus 90 in a high-temperature atmosphere. In this case, during the deposition process, the deposition masks 20, the frame 15, and the organic EL substrate 92, which are held inside the deposition apparatus 90, are also heated. During the process, the deposition mask 20, the frame 15, and the organic EL substrate 92 develop dimensional change behaviors based on their respective thermal expansion coefficients. In this case, when the thermal expansion coefficients of the deposition mask 20, the frame 15, and the organic EL substrate 92 largely differ from one another, positioning displacement occurs because of the difference in dimensional change. As a result, the dimensional precision and the positional precision of the deposition material to be adhered to the organic EL substrate 92 lower.

In order to avoid this problem, the thermal expansion coefficients of the deposition mask 20 and the frame 15 are preferably equivalent to the thermal expansion coefficient of the organic EL substrate 92. For example, when a glass substrate is used as the organic EL substrate 92, an iron alloy containing nickel can be used as a main material of the deposition mask 20 and the frame 15. The iron alloy may further contain cobalt in addition to nickel. For example, an iron alloy containing nickel and cobalt can be used as a material of the metal plate included in the deposition masks 20, where the content of nickel and cobalt is 30 to 54% by mass in sum and the content of cobalt is 0 to 6% by mass. Concrete examples of an iron alloy containing either nickel or nickel and cobalt may be an invar material containing 34 to 38% by mass of nickel, a super invar material containing cobalt in addition to 30 to 34% by mass of nickel, and a low thermal expansion Fe—Ni based plated alloy containing 38 to 54% by mass of nickel.

Unless the deposition mask 20, the frame 15, and the organic EL substrate 92 are heated to a high temperature during the deposition process, thermal expansion coefficients of the deposition mask 20 and the frame 15 may not necessarily be equal to the thermal expansion coefficient of the organic EL substrate 92. In this case, a material other than the aforementioned iron alloy may be used as a material of the deposition mask 20. For example, an iron alloy other than the aforementioned iron alloy containing nickel, such as an iron alloy containing chromium, may be used. Examples of the iron alloy containing chromium that can be used include an iron alloy as it is called stainless. Non-iron alloys such as nickel alloys and nickel-cobalt alloys may also be used.

Next, the deposition mask 20 is described in detail. As illustrated in FIG. 3, the deposition mask 20 may include a pair of tabs (a first tab 17*a* and a second tab 17*b*) having a pair of the shorter sides 27 of the deposition mask 20 and a middle portion 18 positioned between the pair of tabs 17*a* and 17*b*.

The following describes the tabs 17*a* and 17*b* in detail. The tabs 17*a* and 17*b* are portions of the deposition mask 20 fixed to the frame 15. In the present embodiment, the tabs 17*a* and 17*b* are formed integrally with the middle portion 18. Note that the tabs 17*a*, 17*b* and the middle portion 18 may be formed of different members. In this case, the tabs 17*a*, 17*b* and the middle portion 18 are joined together by welding, for example.

The following describes the middle portion 18. The middle portion 18 may include at least one effective area 22 in which the through-hole 25 passing through the first surface 20*a* and the second surface 20*b* is formed, and a peripheral area 23 surrounding the effective area 22. The effective area 22 in the deposition mask 20 faces the display area on the organic EL substrate 92.

In the example illustrated in FIG. 3, the middle portion 18 includes a plurality of the effective areas 22 arranged along the longer side 26 of the deposition mask 20 at predetermined intervals. Each of the effective areas 22 corresponds to the display area of one organic EL display apparatus 100. Thus, the deposition mask apparatus 10 shown in FIG. 1 enables a multifaceted deposition for the organic EL display apparatus 100. Note that one effective area 22 may correspond to a plurality of display areas.

As illustrated in FIG. 3, the contour of each effective area 22 may be, for example, in a substantially quadrangular shape in plan view, more precisely, a substantially rectangular shape in plan view. Although not depicted in the figure, the contour of each effective area 22 may be in any of various shapes in accordance with the shape of the display area on the organic EL substrate 92. For example, the contour of each effective area 22 may be in a circular shape.

Figure 4:
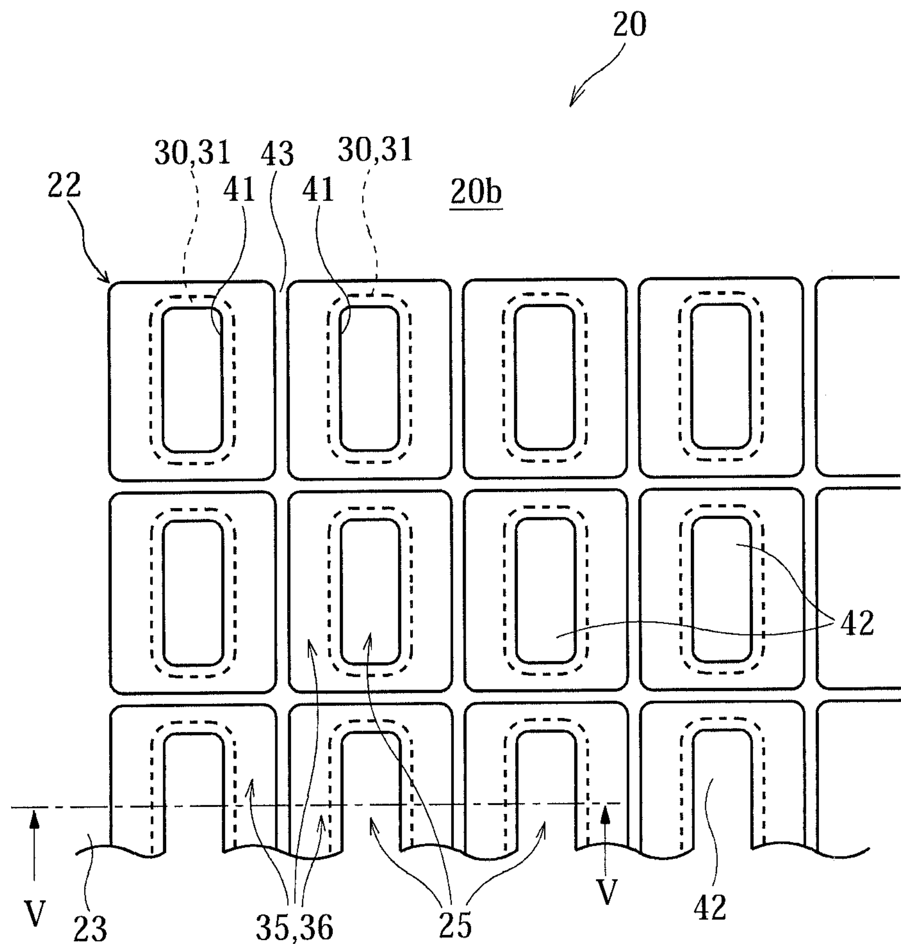
FIG. 4 is a partial plan view showing an effective area in the deposition mask shown in FIG. 3.

The following describes the effective area 22 in detail. FIG. 4 is an enlarged plan view of the effective area 22 as seen from the second surface 20*b* side of the deposition mask 20. As shown in FIG. 4, in the illustrated example, a plurality of the through-holes 25 formed in each effective area 22 may be arranged at predetermined pitches along two directions perpendicular to each other in the effective areas 22.

Figure 5:
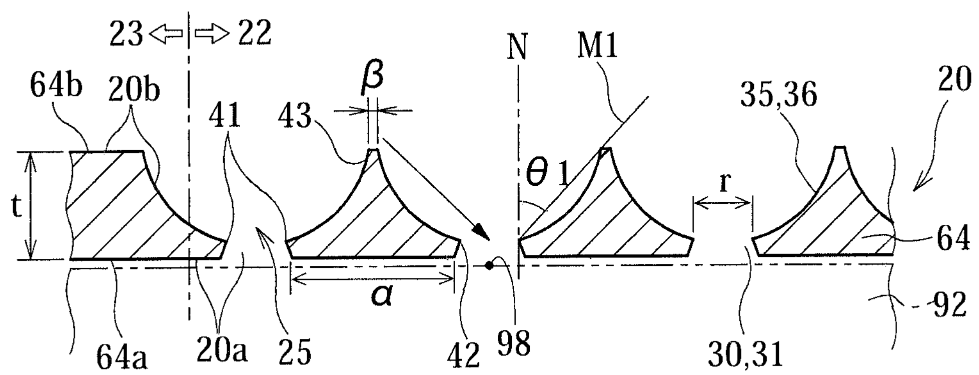
FIG. 5 is a sectional view along the line V-V in FIG. 4.

FIG. 5 is a sectional view of the effective area 22 taken along the direction V-V in FIG. 4. As shown in FIG. 5, a plurality of the through-holes 25 pass through from the first surface 20*a*, which is one side along a normal direction N of the deposition mask 20, to the second surface 20*b*, which is the other side along the normal direction N of the deposition mask 20. In the illustrated example, as described in more detail later, a first recess 30 is formed by an etching process in the first surface 64*a* of the metal plate 64, which serves as the one side in the normal direction N of the deposition mask 20, and a second recess 35 is formed in the second surface 64*b* of the metal plate 64, which serves as the other side in the normal direction N of the deposition mask 20. The first recess 30 is connected to the second recess 35, so that the second recess 35 and the first recess 30 are formed to communicate with each other. Each through-hole 25 is composed of the second recess 35 and the first recess 30 connected to the second recess 35. As shown in FIGS. 4 and 5, a wall surface 31 of the first recess 30 and a wall surface 36 of the second recess 35 are connected via a circumferential connection portion 41. The connection portion 41 defines a through-portion 42 at which the through-hole 25 has a minimum opening area in plan view of the deposition mask 20.

As shown in FIG. 5, the adjacent two through-holes 25 on the first surface 20*a* of the deposition mask 20 are spaced from each other along the first surface 64*a* of the metal plate 64. Similarly, on the side of the second surface 20*b* of the deposition mask 20, the two adjacent second recesses 35 may be spaced from each other along the second surface 64*b* of the metal plate 64. In other words, the second surface 64*b* of the metal plate 64 may remain between the two adjacent second recesses 35. In the below description, a portion of the effective area 22 of the second surface 64*b* of the metal plate 64, which is not etched and thus remains, may be referred to as a top portion 43. By producing the deposition mask 20 such that such top portion 43 remains, the deposition mask 20 can have a sufficient strength. Thus, it can be prevented that the deposition mask 20 is damaged during transportation, for example. However, when a width β of the top portion 43 is too large, there is a possibility that shadow occurs in the deposition step, which lowers utilization efficiency of the deposition material 98. Thus, the deposition mask 20 is preferably produced such that the width β of the top portion 43 is not excessively large. The term shadow refers to a phenomenon in which a deposition material is prevented from depositing on the deposition target, e.g., the organic EL substrate 92, in an area overlapping the through-hole in the deposition mask 20 attributable to the second surface 20*b* or wall surfaces of the deposition mask 20.

When the deposition mask apparatus 10 is placed inside the deposition apparatus 90 as in FIG. 1, the first surface 20*a* of the deposition mask 20 faces the organic EL substrate 92 as indicated by the two-dot chain lines in FIG. 5, and the second surface 20*b* of the deposition mask 20 is located on the side of the crucible 94 holding the deposition material 98. Thus, the deposition material 98 adheres to the organic EL substrate 92 through the second recess 35 whose opening area gradually decreases. As shown by the arrow in FIG. 5 extending from the second surface 20*b* toward the first surface 20*a*, the deposition material 98 not only moves from the crucible 94 toward the organic EL substrate 92 along the normal direction N of the substrate 92, but also may move along a direction greatly inclined with respect to the normal direction N of the organic EL substrate 92. At this time, when the thickness of the deposition mask 20 is large, the diagonally moving deposition material 98 is more likely to be stuck on the top portion 43, the wall surface 36 of the second recess 35, or the wall surface 31 of the first recess 30. As a result, the deposition material 98 in a greater proportion may fail to pass through the through-hole 25. Thus, in order to improve a utilization efficiency of the deposition material 98, it is considered to be preferable that the thickness t of the deposition mask 20 is reduced so that heights of the wall surface 36 of the second recess 35 and the wall surface 31 of the first recess 30 are reduced. In other words, it can be said that it is preferable that a metal plate 64, which has the thickness t as small as possible as long as the strength of the deposition mask 20 is ensured, is used as the metal plate 64 for forming the deposition mask 20. Taking this point into consideration, in the present embodiment, the thickness t of the deposition mask 20 may be 100 μm or less, 50 μm or less, 40 μm or less, 35 μm or less, 30 μm or less, 25 μm or less, 20 μm or less, 18 μm or less, or 15 μm or less. On the other hand, when the thickness of the deposition mask 20 is excessively small, the deposition mask 20 has a lower strength and is more likely to suffer damage and deformation. Taking this point into consideration, the thickness t of the deposition mask 20 may be 5 μm or greater, 8 μm or greater, 10 μm or greater, 12 μm or greater, 13 μm or greater, or 15 μm or greater. The thickness t is a thickness of the peripheral area 23, i.e., a thickness of a part of the deposition mask 20 where the first recess 30 and the second recess 35 are not formed. Therefore, the thickness t can be said as a thickness of the metal plate 64.

The thickness t of the deposition mask 20 may be in a range determined by combining any one of the foregoing candidate values for an upper limit and any one of the foregoing candidate values for a lower limit. For example, the thickness t of the deposition mask 20 may be 5 to 100 μm, 8 to 50 μm, 10 to 40 μm, 12 to 35 μm, 13 to 30 μm, 15 to 25 μm, or 15 to 20 μm. Alternatively, the thickness t of the deposition mask 20 may be in a range determined by combining any two of the foregoing candidate values for an upper limit. For example, the thickness t of the deposition mask 20 may be 50 to 100 μm. Alternatively, the thickness t of the deposition mask 20 may be in a range determined by combining any two of the foregoing candidate values for a lower limit. For example, the thickness t of the deposition mask 20 may be 5 to 8 μm.

In FIG. 5, a minimum angle defined by a line M1, which passes the connection portion 41 defining a minimum opening area of the through-hole 25 and another given position of the wall surface 36 of the second recess 35, with respect to the normal direction N of the deposition mask 20 is represented by a symbol θ1. In order that the diagonally moving deposition material 98 can be caused to reach the organic EL substrate 92 without being caused to reach the wall surface 36 as much as possible, it is advantageous that the angle θ1 is increased. In order to increase the angle θ1, it is effective to reduce the aforementioned width β of the top portion 43, as well as to reduce the thickness t of the deposition mask 20.

In FIG. 5, the symbol α represents a width of a portion (hereinafter also referred to as "rib portion") of the effective area 22 of the first surface 64*a* of the metal plate 64, which is not etched and thus remains. A width α of the rib portion and a size r of the through-portion 42 are suitably determined depending on a size of an organic EL display device and its display pixels. For example, the width α of the rib portion is 5 to 40 μm, and the size r of the through-portion 42 is 10 to 60 μm.

The width α of the rib portion may be 10 μm or greater, 15 μm or greater, or 20 μm or greater. The width α of the rib portion may be 35 μm or less, 30 μm or less, or 25 μm or less. The width α of the rib portion may be in a range determined by combining any one of the foregoing candidate values for an upper limit and any one of the foregoing candidate values for a lower limit. For example, the width α of the rib portion may be 10 to 35 μm, 15 to 30 μm, or 20 to 25 μm. Alternatively, the width α of the rib portion may be in a range determined by combining any two of the foregoing candidate values for an upper limit. For example, the width a of the rib portion may be 35 to 40 μm. Alternatively, the width α of the rib portion may be in a range determined by combining any two of the foregoing candidate values for a lower limit. For example, the width a of the rib portion may be 5 to 10 μm.

The size r of the through-portion 42 may be 15 μm or greater, 20 μm or greater, 25 μm or greater, or 30 μm or greater. The lower limit of the size r of the through-portion 42 may be less than 10 μm mentioned above. For example, the size r of the through-portion 42 may be 5 μm or greater. The size r of the through-portion 42 may be 55 μm or less, 50 μm or less, 45 μm or less, 40 μm or less, or 35 μm or less. The size r of the through-portion 42 may be in a range determined by combining any one of the foregoing candidate values for an upper limit and any one of the foregoing candidate values for a lower limit. For example, the size r of the through-portion 42 may be 15 to 55 μm, 20 to 50 μm, 25 to 45 μm, 30 to 40 μm, or 30 to 35 μm. Alternatively, the size r of the through-portion 42 may be in a range determined by combining any two of the foregoing candidate values for an upper limit. For example, the size r of the through-portion 42 may be 55 to 60 μm. Alternatively, the size r of the through-portion 42 may be in a range determined by combining any two of the foregoing candidate values for a lower limit. For example, the size r of the through-portion 42 may be 5 to 10 μm.

FIGS. 4 and 5 show an example in which the second surface 64*b* of the metal plate 64 remain between the two adjacent second recesses 35, but this is not restrictive. Although not depicted, the etching process may be performed such that two adjacent second recesses 35 are connected to each other. In other words, there may be a part where no second surface 64*b* of the metal plate 64 remains between two adjacent second recesses 35.

A method for manufacturing the deposition mask 20 will now be described.

First, a manufacturing method for a metal plate used for manufacturing the deposition mask is described. In an example illustrated in the present embodiment, the metal plate is formed of a rolled sheet made of an iron alloy containing nickel. The rolled sheet may have a thickness of 100 μm or less, preferably 40 μm or less. The rolled sheet may contain 30 to 38% by mass of nickel, 0 to 6% by mass of cobalt, balancing iron, and unavoidable impurities.

The method begins with preparing iron, nickel, and other raw materials. For example, the individual raw materials are prepared such that the content of iron and the content of nickel in the raw materials are about 64% by weight and about 36% by weight, respectively. Next, the melting step is performed by which the individual raw materials, which are crushed in advance if necessary, are melted in a melting furnace. For example, the individual raw materials are melted through gaseous discharge such as arc discharge and are then mixed. In this way, a base metal for the metal plate can be obtained.

The melting temperature is set on the basis of the raw materials, and an example thereof is 1,500° C. or higher. For the purpose of, for example, deoxidation, dewatering, or denitrification, the melting step may include a step of supplying aluminum, manganese, silicon, or the like into the meting furnace. The melting step may be performed in an environment at a pressure lower than atmospheric pressure and under an inert gas (e.g., argon gas) atmosphere.

After the base metal is removed from the melting furnace, a grinding step of grinding surfaces of the base metal may be performed. This can remove scales and oxide films. The grinding step is not limited to any specific method, examples of which include the so-called grinding method by which surfaces of the base metal are ground by rotating a grinding wheel and the so-called pressing method by which surfaces of the base metal are ground by pressing the base metal into a cutting tool. The grinding step may be performed such that the base metal has a uniform thickness.

Figure 6:
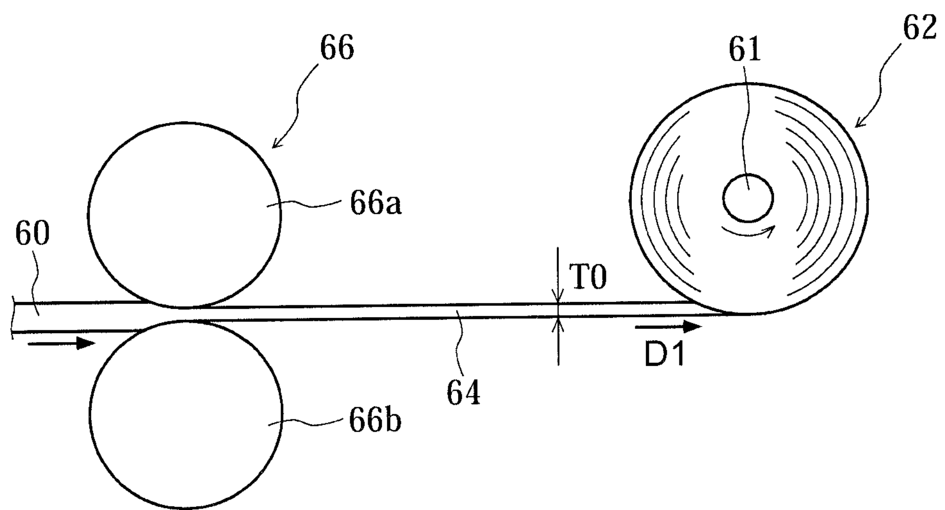
FIG. 6 is a view showing a step of obtaining a metal plate having a desired thickness by rolling a base metal.

Next, as illustrated in FIG. 6, the rolling step is performed to flatten the base metal 60 formed of an iron alloy containing nickel. For example, the base metal is transported toward a rolling apparatus 66 including a pair of reduction rolls (work rolls) 66*a* and 66*b* in the direction indicated by the arrow D1 while a pull tensile force is applied to the base metal. The base metal 60 having reached between the pair of reduction rolls 66*a* and 66*b* is rolled by the pair of reduction rolls 66*a* and 66*b*. As a result, the base metal 60 has a reduced thickness and is elongated along the transport direction. Thus, the metal plate 64 elongated in the direction D1 and having a certain thickness can be obtained. The direction D1 in which the metal plate 64 is elongated may be hereinafter referred to as the longitudinal direction D1. When the metal plate 64 is produced through rolling, rolling streaks extending in the longitudinal direction D1 are formed on the metal plate 64. As shown in FIG. 6, a winding body 62 may be formed by winding up the metal plate 64 around a core 61.

FIG. 6 merely shows the rolling step schematically, and a concrete structure and procedure for performing the rolling step are not specifically limited. For example, the rolling step may include a hot rolling step of processing the base metal at a temperature not lower than a recrystallization temperature of the iron alloy constituting the base metal 60, and a cold rolling step of processing the base metal at a temperature not higher than the recrystallization temperature of the iron alloy. In addition, an orientation along which the base metal 60 and the metal plate 64 pass through between the reduction rolls 66*a* and 66*b* is not limited to one direction. For example, in FIGS. 6 and 7, the base metal 60 and the metal plate 64 may be gradually rolled by repeatedly passing the base metal 60 and the metal plate 64 through between the pair of reduction rolls 66*a* and 66*b* in an orientation from the left side to the right side in a sheet plane, and in an orientation from the right side to the left side in the sheet plane.

For the purpose of adjusting the shape of the metal plate 64, the rolling step may include adjusting the rolling actuator pressure. In addition to the shape of the reduction rolls (work rolls) 66*a* and 66*b*, the shape of a back-up roll may be adjusted as appropriate.

The cold rolling step may include supplying a coolant, such as kerosene or neat oil, to a space between the base metal 60 and the reduction rolls 66*a* and 66*b*. In this way, the base metal temperature can be controlled.

Before and after the rolling step or during the rolling step, an analysis step of analyzing quality and characteristics of the base metal 60 or the metal plate 64 may be performed. For example, the base metal 60 or the metal plate 64 may be irradiated with fluorescent x-rays to analyze the composition thereof. Thermomechanical analysis (TMA) may also be conducted to measure the amount of thermal expansion of the base metal 60 or the metal plate 64.

Figure 7:
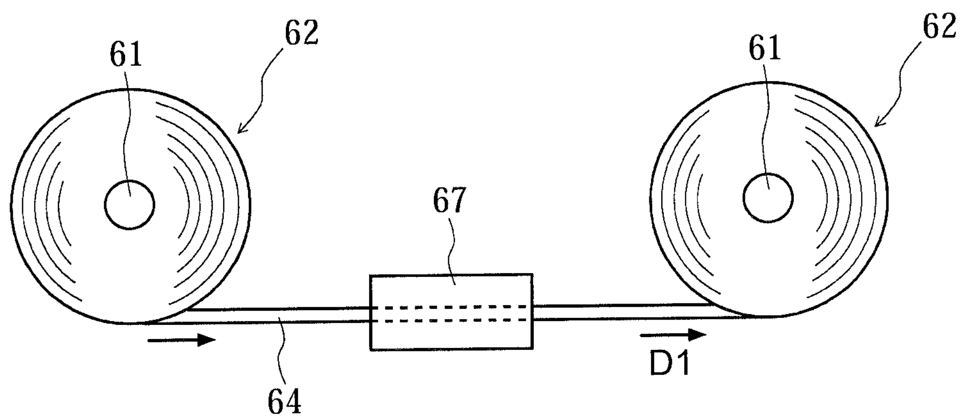
FIG. 7 is a view showing a step of annealing the metal plate obtained by rolling.

Subsequently, in order to remove a remaining stress accumulated in the metal plate 64 by the rolling process, an annealing step may be performed to anneal the metal plate 64 using an annealing apparatus 67 as illustrated in FIG. 7. As shown in FIG. 7, the annealing step may be performed while the metal plate 64 is being pulled in the transport direction (longitudinal direction). In other words, the annealing step may be performed as a continuous annealing process while the metal plate is being transported, instead of a batch-type annealing process. In this case, it is preferable to set a temperature and a transport speed so as to prevent the metal plate 64 from suffering buckling bend or other deformation. By performing the annealing step, it is possible to obtain the metal plate 64 from which the remaining strain is removed to a certain extent. In the example shown in FIG. 7, the metal plate 64 is transported in a horizontal direction during the annealing step, but this is not restrictive. The metal plate 64 may be transported in a vertical or some other direction during the annealing step.

Conditions for the annealing step are suitably set depending on the thickness of the metal plate 64 and the reduction ratio thereof. For example, the annealing step is performed for 30 to 90 seconds at 500 to 600° C. The number of seconds above refers to a time period during which the metal plate 64 passes through a space in the annealing apparatus 67 at a controlled certain temperature. The temperature for the annealing step may be set so as not to cause the metal plate 64 to be softened.

The lower limit of the temperature for the annealing step may be lower than 500° C. mentioned above. For example, the temperature for the annealing step may be 400° C. or higher, or 450° C. or higher. The upper limit of the temperature for the annealing step may be higher than 600° C. mentioned above. For example, the temperature for the annealing step may be 700° C. or lower, or 650° C. or lower. The temperature for the annealing step may be in a range determined by combining any one of the foregoing candidate values for an upper limit and any one of the foregoing candidate values for a lower limit. For example, the temperature for the annealing step may be 400° C. to 700° C., or 450° C. to 650° C. Alternatively, the temperature for the annealing step may be in a range determined by combining any two of the foregoing candidate values for an upper limit. For example, the temperature for the annealing step may be 650° C. to 700° C. Alternatively, the temperature for the annealing step may be in a range determined by combining any two of the foregoing candidate values for a lower limit. For example, the temperature for the annealing step may be 400° C. to 450° C.

The duration of the annealing step may be 40 seconds or longer, or 50 seconds or longer. The lower limit of the duration of the annealing step may be shorter than 30 seconds mentioned above. For example, the duration of the annealing step may be 10 seconds or longer, or 20 seconds or longer. The duration of the annealing step may be 80 seconds or shorter, 70 seconds or shorter, or 60 seconds or shorter. The upper limit of the duration of the annealing step may be longer than 90 seconds mentioned above. For example, the duration of the annealing step may be 100 seconds or shorter. The duration of the annealing step may be in a range determined by combining any one of the foregoing candidate values for an upper limit and any one of the foregoing candidate values for a lower limit. For example, the duration of the annealing step may be 10 to 100 seconds, 20 to 90 seconds, 30 to 80 seconds, 40 to 70 seconds, or 50 to 60 seconds. Alternatively, the duration of the annealing step may be in a range determined by combining any two of the foregoing candidate values for an upper limit. For example, the duration of the annealing step may be 90 to 100 seconds. Alternatively, the duration of the annealing step may be in a range determined by combining any two of the foregoing candidate values for a lower limit. For example, the duration of the annealing step may be 10 to 20 seconds.

The aforementioned annealing step is preferably performed in an irreducible atmosphere or an inert gas atmosphere. The irreducible atmosphere herein means an atmosphere free of reducing gas such as hydrogen. The expression "free of reducing gas" means that a concentration of reducing gas such as hydrogen is 10% or less. The concentration of a reducing gas in the annealing step may be 8% or less, 6% or less, 4% or less, 2% or less, or 1% or less. The inert gas atmosphere means an atmosphere where inert gas such as argon gas, helium gas, or nitrogen gas is present in a concentration of 90% or more. In the annealing step, the concentration of an inert gas may be 92% or higher, 94% or higher, 96% or higher, 98% or higher, or 99% or higher. By performing the annealing step in the irreducible atmosphere or the inert gas atmosphere, a nickel compound such as nickel hydroxide can be prevented from being created on a surface layer of the metal plate 64. The annealing apparatus 67 may include a mechanism for monitoring the concentration of an inert gas or a mechanism for adjusting the concentration of an inert gas.

Prior to the annealing step, a cleaning step of cleaning the metal plate 64 may be performed. As a result, foreign matters can be inhibited from sticking on a surface of the metal plate 64 during the annealing step. Examples of a cleaning liquid that can be used for the cleaning include a hydrocarbon-based liquid.

FIG. 7 shows the example in which the annealing step is performed while the metal plate 64 is being pulled in the longitudinal direction. However, this is not restrictive, and the annealing step may be performed with the metal plate 64 wound around the core 61. In other words, the batch-type annealing process may be performed. When the annealing step is performed while the metal plate 64 is wound around the core 61, the metal plate 64 may have a warping tendency corresponding to a winding diameter of the winding body 62. Thus, depending on a winding diameter of the winding body 62 and/or a material forming the base metal 60, it is advantageous to perform the annealing step while the metal plate 64 is being pulled in the longitudinal direction.

After that, on the metal plate 64 that has undergone the rolling step, a slitting step may be performed to cut off both ends of the metal plate 64 with respect to the width direction over a predetermined range, so that the width of the metal plate 64 falls within a predetermined range. The slitting step is performed to remove a crack that may be generated on both ends of the metal plate 64 because of the rolling step. Due to the slitting step, it can be prevented that a breakage phenomenon of the metal plate 64, which is so-called plate incision, occurs from the crack as a starting point.

The amount of the cutting off in the slitting process may be adjusted so that the metal plate 64 becomes symmetrical along the width direction after the slitting step. The slitting step may be performed prior to the above-described annealing step.

The metal plate 64 being elongated and having a predetermined thickness may be produced by repeating a plurality of times at least two of the above-described rolling step, annealing step, and slitting step.

After the annealing step, an inspection step is performed to inspect surfaces of the metal plate 64. Specifically, it is checked whether the light reflectance of a surface of the metal plate 64 falls within a predetermined range. The following provides background information pertaining to conducting such inspection. Note that a surface of the metal plate 64 refers to the first surface 64*a* or the second surface 64*b* of the metal plate 64.

The present inventors have conducted extensive studies to find a correlation between the adhesion of a resist film to a surface of the metal plate 64 and the light reflectance of the surface of the metal plate 64. Specifically, in regions of the metal plate 64 of the type the present applicant uses, it has been found that a resist film adheres to a surface of the metal plate 64 more firmly as the light reflectance of the surface of the metal plate 64 becomes lower. Therefore, measuring the light reflectance of a surface of the metal plate 64 provides information about the adhesion of a resist film to the surface of the metal plate 64. The resist film refers to, for example, a layer serving as a mask when the through-holes 25 are made by etching the metal plate 64.

The following describes some reasons why a resist film adheres to the metal plate 64 more firmly as the light reflectance of a surface of the metal plate 64 is lower. In the case where the metal plate 64 is produced by rolling, very small dents or irregularities such as oil pits and rolling streaks are created on a surface of the metal plate 64. The oil pits are dents created on a surface of the metal plate 64 attributable to a rolling oil being present between the base metal 60 and the reduction rolls 66*a* and 66*b*. The light reflectance of a surface of the metal plate 64 becomes lower as these dents or irregularities are more densely distributed. When a resist film disposed on a surface of the metal plate 64 is deformable following such dents or irregularities, the area of the resist film in contact with the surface of the metal plate 64 becomes larger as the dents or irregularities are more densely distributed. It is believed that this results in the phenomenon in which a resist film adheres to the metal plate 64 more firmly as the light reflectance of a surface of the metal plate 64 is lower. Note that the aforementioned reasons constitute an inference only and it is not denied that there may be some other reasons for the correlation between the light reflectance and the adhesion.

As described above, the light reflectance of a surface of the metal plate 64 becomes lower as dents or irregularities such as oil pits and rolling streak are more densely distributed thereon. Therefore, an evaluation of very small dents and irregularities can be made by measuring the light reflectance of a surface of the metal plate 64. In other words, information about microscopic characteristics such as dents and irregularities can be acquired by conducting a macroscopic evaluation of the light reflectance.

A method for measuring the light reflectance of a surface of the metal plate 64 will now be described. By way of example, the following describes measurement of the light reflectance of the second surface 64*b* of the metal plate 64.

Figure 8:
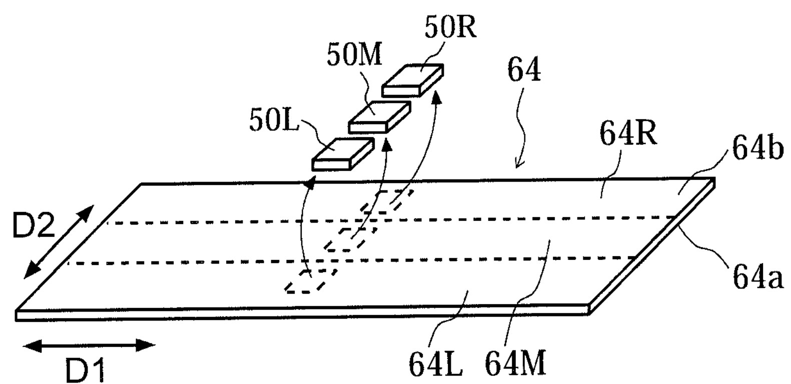
FIG. 8 is a view showing a step of taking out specimens from the metal plate.

First, the metal plate 64 that is elongated along the longitudinal direction D1 as shown in FIG. 8 is prepared. In FIG. 8, the symbol D2 represents a width direction orthogonal to the longitudinal direction D1. Both the first surface 64*a* and the second surface 64*b* of the metal plate 64 extend in the longitudinal direction D1 and in the width direction D2. The size of the metal plate 64 along the width direction D2 is 100 to 1,000 mm and may be 500 mm, for example.

The size of the metal plate 64 along the width direction D2 may be 200 mm or longer, 300 mm or longer, 400 mm or longer, or 500 mm or longer. The size of the metal plate 64 along the width direction D2 may be 900 mm or shorter, 800 mm or shorter, 700 mm or shorter, or 600 mm or shorter. The size of the metal plate 64 along the width direction D2 may be in a range determined by combining any one of the foregoing candidate values for an upper limit and any one of the foregoing candidate values for a lower limit. For example, the size of the metal plate 64 along the width direction D2 may be 200 to 900 mm, 300 to 800 mm, 400 to 700 mm, or 500 to 600 mm. Alternatively, the size of the metal plate 64 along the width direction D2 may be in a range determined by combining any two of the foregoing candidate values for an upper limit. For example, the size of the metal plate 64 along the width direction D2 may be 900 to 1,000 mm. Alternatively, the size of the metal plate 64 along the width direction D2 may be in a range determined by combining any two of the foregoing candidate values for a lower limit. For example, the size of the metal plate 64 along the width direction D2 may be 100 to 200 mm.

Next, a plurality of specimens are prepared by cutting the metal plate 64. For example, as illustrated in FIG. 8, three specimens, namely a first specimen 50L, a second specimen 50M, and a third specimen 50R, are prepared. As shown in FIG. 8, the three specimens, namely the first specimen 50L, the second specimen 50M, and the third specimen 50R, are taken from a first region 64L, a second region 64M, and a third region 64R, respectively, of the metal plate 64. The first region 64L, the second region 64M, and the third region 64R are arranged from one end to the other end of the metal plate 64 with respect to the width direction D2. The first region 64L, the second region 64M, and the third region 64R have the same predetermined length along the width direction D2 of the metal plate 64. When the following description is provided about a configuration or other characteristics that the first specimen 50L, the second specimen 50M, and the third specimen 50R have in common, the first specimen 50L, the second specimen 50M, and the third specimen 50R may be collectively referred to as the specimen 50. Each of the sizes of the specimen 50 along the longitudinal direction D1 and the width direction D2 is 20 to 100 mm and may be 50 mm, for example.

The next step is preparing a measuring instrument including a light source that produces light to be emitted to the specimen 50 of the metal plate 64 and a detector that detects the light reflected from the specimen 50. As an example of the measuring instrument, the Gonio Photometer GP-200 made by Murakami Color Research Laboratory can be used. In this case, the light source may be a halogen lamp, for example. The measuring instrument may further include a regulator that regulates, for example, intensities of the light emitted to the specimen 50 or of the light reaching the detector. The measuring instrument may further include, for example, a neutral density filter or an aperture positioned between the light source and the specimen 50 or between the specimen and the detector.

Next, the measuring instrument is calibrated. Specifically, first, the light source and the detector are placed to be spaced apart by a predetermined distance, and the light source emits light to the detector. At this time, the light from the light source directly enters the detector. The distance is determined so as to be equal to the light path length from one end where the light is emitted by the light source to the other end where the light reflected from the specimen 50 reaches the detector. Then, the light intensity detected by the detector is recorded as a reference intensity.

Figure 9:
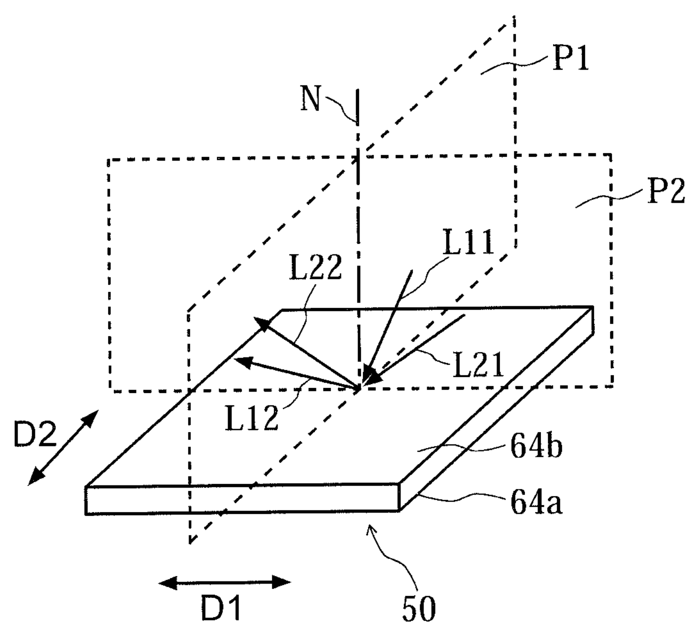
FIG. 9 is a view showing a step of measuring a reflectance of a specimen.

Then, as illustrated in FIG. 9, a measuring step is performed to measure the light reflectance by causing the light from the light source to enter the specimen 50 and using the detector to detect the light reflected by regular reflection from the surface of the specimen 50 (the light may be hereinafter referred to as reflected light). The reflectance is calculated as a percentage of the intensity of the reflected light as detected by the detector relative to the aforementioned reference intensity. In the measuring step, intensities of the reflected light outgoing at various angles from the surface of the specimen 50 may be measured by changing the angle or position of the detector. For example, intensities of the reflected light outgoing at an angle of 30 to 60° from the surface of the specimen 50 may be measured at predetermined angle intervals, such as, for example, at 0.1° intervals. In the present embodiment, the light reflectance is calculated by using the reflected light outgoing at an angle falling within a range of 45°±0.2° from the surface of the specimen 50, from among reflected light rays outgoing at various angles.

In the description below, the light reflectance of the first surface 64*a* of the specimen 50 may be referred to as the first surface reflectance, while the light reflectance of the second surface 64*b* of the specimen 50 may be referred to as the second surface reflectance. In addition, the first surface reflectance and the second surface reflectance may be collectively called the surface reflectance. In the example illustrated in FIG. 9, the reflectance of the second surface 64*b* of the specimen 50, namely the second surface reflectance, is measured.

The surface reflectance may be calculated by taking an average of a first reflectance measured in a first plane P1 and a second reflectance measured in a second plane P2.

As shown in FIG. 9, the first plane P1 is orthogonal to surfaces including the first surface 64*a* and to the longitudinal direction D1. In FIG. 9, the symbol L11 represents the light incident on the specimen 50 in the first plane P1 while the symbol L12 represents the reflected light outgoing from the specimen 50 in the first plane P1.

As shown in FIG. 9, the second plane P2 is orthogonal to surfaces including the first surface 64*a* and to the width direction D2. In FIG. 9, the symbol L21 represents the light incident on the specimen 50 in the second plane P2 while the symbol L22 represents the reflected light outgoing from the specimen 50 in the second plane P2.

The foregoing measurement of the reflectance may be conducted on each of a plurality of the specimens 50, and an average of the measured values for the individual specimens 50 may be used as the surface reflectance according to the present embodiment. For example, an average of the reflectances of a surface such as the first surface 64*a* as measured on the aforementioned first specimen 50L, second specimen 50M, and third specimen 50R may be used as the first surface reflectance according to the present embodiment. In the case where reflectances are measured in the first plane P1 and in the second plane P2 as described above, an average of values measured on a plurality of specimens 50 in the first plane P1 and values measured on a plurality of specimens 50 in the second plane P2 may be used as the surface reflectance according to the present embodiment.

Next, a determining step is performed to determine whether the metal plate 64 is good on the basis of the obtained surface reflectance value. In the determining step, the metal plate 64 may be determined to be good if, for example, at least one of the following judgment conditions A and B is satisfied. In the determining step, the metal plate 64 may be determined to be good if both of the following judgment conditions A and B are satisfied.

Judgment condition A: The metal plate 64 has a surface reflectance of 8% or higher.

Judgment condition B: The metal plate 64 has a surface reflectance of 25% or lower.

The judgment condition A is intended for ensuring that alignment marks formed on the metal plate 64 in the deposition mask 20 are satisfactorily detected, as described later. An alignment mark is formed as, for example, a portion having a lower reflectance than other surrounding portions of the metal plate 64. Then, when the reflectance of the metal plate 64 itself is lower, the difference is smaller between a reflectance of the alignment mark and a reflectance of surrounding portions, and thus the alignment mark is more difficult to detect. Therefore, setting a lower limit of the surface reflectance of the metal plate 64 like the judgment condition A above is effective in ensuring detectability of alignment marks.

The judgment condition B is intended for ensuring that a resist film firmly adheres to a surface of the metal plate 64, thereby improving accuracy of the area of the through-hole 25 that is formed by etching the metal plate 64 while the resist film serves as a mask. This is supported by Examples described later.

In the determining step, the metal plate 64 may be determined to be good if the judgment condition C described below is satisfied in addition to the judgment conditions A and B above.

Judgment condition C: The metal plate 64 has a surface reflectance of 20% or lower.

The judgment condition C is intended for ensuring that a resist film more firmly adheres to a surface of the metal plate 64, thereby improving accuracy of the area of the through-hole 25 that is formed by etching the metal plate 64 while the resist film serves as a mask. This is supported by Examples described later. A higher etching factor is obtained as a resist film adheres to the metal plate 64 more firmly. In other words, the etching along the thickness direction of the metal plate 64 is facilitated. As a result, a smaller-sized through-hole 25 can be made in the metal plate 64 while the variation in size of the through-holes 25 can be reduced.

The above judgment conditions A, B, and C to be satisfied may be applied to a surface reflectance that is measured when the light is caused to be incident on a surface of the metal plate 64 at an incident angle of 45°±0.2° in at least one plane orthogonal to the surface. The judgment conditions A, B, and C to be satisfied may also be applied to a calculated average of the first reflectance and the second reflectance described above.

The metal plate 64 satisfying conditions including the above-mentioned judgment conditions A, B, and C can be produced by adjusting conditions for the rolling step among others. For example, in the rolling step, the number of oil pits and areas thereof formed on the metal plate 64 can be increased by increasing the amount of a rolling oil supplied between the base metal 60 and the reduction rolls 66*a* and 66*b*.

As a result, the light reflectance of a surface of the metal plate 64 can be lowered. To the contrary, the amount of a rolling oil brought between the base metal 60 and the reduction rolls 66*a* and 66*b* can be decreased by supplying a reduced amount of the rolling oil. As a result, the light reflectance of a surface of the metal plate 64 can be increased.

The amount of a rolling oil brought between the base metal 60 and the reduction rolls 66*a* and 66*b* can also be increased in the rolling step by increasing the rolling speed, that is, increasing the speed at which the base metal 60 is transported. As a result, the light reflectance of a surface of the metal plate 64 can be lowered. To the contrary, the amount of a rolling oil brought between the base metal 60 and the reduction rolls 66*a* and 66*b* can be decreased by decreasing the rolling speed. As a result, the light reflectance of a surface of the metal plate 64 can be increased.

The rolling speed is preferably 30 m/minute or higher. The rolling speed may be 50 m/minute or higher, 70 m/minute or higher, or 100 m/minute or higher. The rolling speed is preferably 200 m/minute or lower. The rolling speed may be 150 m/minute or lower, 100 m/minute or lower, or 80 m/minute or lower.

The rolling speed may be in a range determined by combining any one of the foregoing candidate values for an upper limit and any one of the foregoing candidate values for a lower limit. For example, the rolling speed may be 30 m/minute or more and 200 m/minute or less, or 50 m/minute or more and 150 m/minute or less. Alternatively, the rolling speed may be in a range determined by combining any two of the foregoing candidate values for an upper limit. For example, the rolling speed may be 150 m/minute or more and 200 m/minute or less, or 100 m/minute or more and 150 m/minute or less. Alternatively, the rolling speed may be in a range determined by combining any two of the foregoing candidate values for a lower limit. For example, the rolling speed may be in a range of 30 m/minute or more and 50 m/minute or less, or 50 m/minute or more and 70 m/minute or less. The rolling speed is preferably 30 m/minute or more and 200 m/minute or less, more preferably 30 m/minute or more and 150 m/minute or less, more preferably 30 m/minute or more and 100 m/minute or less, and still more preferably 30 m/minute or more and 80 m/minute or less.

The light reflectance of a surface of the metal plate 64 can also be decreased by increasing the diameter of a work roll. By contrast, the light reflectance of a surface of the metal plate 64 can be increased by decreasing the diameter of a work roll.

The diameter of a work roll is preferably 28 mm or larger. The diameter of a work roll may be 40 mm or larger or 50 mm or larger. The diameter of a work roll is preferably 150 mm or smaller. The diameter of a work roll may be 120 mm or smaller, 100 mm, or 80 mm or smaller.

The diameter of a work roll may be in a range determined by combining any one of the foregoing candidate values for an upper limit and any one of the foregoing candidate values for a lower limit. For example, the diameter of a work roll may be 28 mm or more and 150 mm or less, or 40 mm or more and 120 mm or less. Alternatively, the diameter of a work roll may be in a range determined by combining any two of the foregoing candidate values for an upper limit. For example, the diameter of a work roll may be 120 mm or more and 150 mm or less. Alternatively, the diameter of a work roll may be in a range determined by combining any two of the foregoing candidate values for a lower limit. For example, the diameter of a work roll may be 28 mm or more and 40 mm or less. The diameter of a work roll is preferably 28 mm or more and 150 mm or less, more preferably 40 mm or more and 120 mm or less, more preferably 50 mm or more and 100 mm or less, and still more preferably 50 mm or more and 80 mm or less.

The number of oil pits, the number of rolling streaks, and areas of oil pits and rolling streaks formed on a surface of the metal plate 64 can also be adjusted by suitably selecting a rolling oil. For example, neat oil can be used as the rolling oil. Neat oil is characteristic in that its viscosity is slow to rise during the rolling step. Therefore, using neat oil as the rolling oil can decrease the amount of a rolling oil brought between the base metal 60 and the reduction rolls 66*a* and 66*b*. As a result, oil pits can be inhibited from being formed on a surface of the metal plate 64.

The number oil pits, the number of rolling streaks, and areas of oil pits and rolling streaks formed on a surface of the metal plate 64 can also be adjusted by suitably selecting surface roughness of a work roll. For example, reducing the surface roughness Ra of a work roll can inhibit rolling streaks from being formed on a surface of the metal plate 64. The surface roughness Ra of a work roll is preferably 0.2 μm or less. The surface roughness Ra of a work roll may be 0.15 μm or less, 0.1 μm or less, or 0.05 μm or less. The surface roughness Rz of a work roll is preferably 2.0 μm or less. The surface roughness Rx of a work roll may be 1.5 μm or less, 1.0 μm or less, or 0.5 μm or less. The surface roughness Rz of a work roll is preferably 2.0 μm or less. The surface roughness Rz of a work roll may be 1.5 μm or less, 1.0 μm or less, or 0.5 μm or less. The surface roughness parameters Ra and Rz are measured in accordance with JIS B 0601: 2013.

In the determining step, the metal plate 64 may be determined to be good if the judgment condition D described below is satisfied in addition to the judgment conditions above.

Judgment condition D: The value obtained by dividing the first reflectance measured in the first plane P1 by the second reflectance measured in the second plane P2 is 0.70 to 1.30.

The judgment condition D represents setting an upper limit of the difference between the first reflectance and the second reflectance. The following describes significance of the judgment condition D.

The present inventors have conducted studies to find that the through-hole 25 made in the metal plate 64 is more likely to deviate from its design shape when there is a greater difference between the first reflectance and the second reflectance. For example, the present inventors have found that, when there is a greater difference between the first reflectance and the second reflectance, the difference between the size of the through-hole 25 along the longitudinal direction D1 of the metal plate 64 and the size of the through-hole 25 along the width direction D2 of the metal plate 64 is more likely to deviate from the design value.

It is believed that, when the metal plate 64 has a higher surface reflectance, the resist film adheres to a surface of the metal plate 64 less firmly, with the result that part of the metal plate 64 layered on the resist film is more easily etched. Therefore, it is conceivable that the difference between the size of the through-hole 25 along the longitudinal direction D1 and the size of the through-hole 25 along the width direction D2 is more likely to deviate from the design value when there is a greater difference between the first reflectance and the second reflectance. By way of example, suppose that the through-hole 25 has the same design value for the size along the longitudinal direction D1 and for the size along the width direction D2. Then, concerning an actually made through-hole 25, when there is a greater difference between the first reflectance and the second reflectance, it is more likely that a difference arises between the size along the longitudinal direction D1 and the size along the width direction D2. To be specific, the through-hole 25 being circular in design shape tends to be oval in shape of the through-hole 25 that is actually made.

Note that the aforementioned reasons constitute an inference only and it is not denied that there may be some other reasons for the correlation between a difference between the first and second reflectances and a size deviation of the through-hole 25.

As described above, the deposition mask 20 is fixed to the frame 15 while being stretched along the plane direction. The amount of elongation of the deposition mask 20 being stretched depends on the stiffness and other mechanical properties of the deposition mask 20. Both the size of the through-hole 25 along the longitudinal direction D1 and the size of the through-hole 25 along the width direction D2 affect the stiffness and other mechanical properties of the deposition mask 20. Hence, when there is a greater difference between the size of the through-hole 25 along the longitudinal direction D1 and the size of the through-hole 25 along the width direction D2, the stiffness and other mechanical properties of the deposition mask 20 may deviate from their expected values. In this case, the amount of elongation of the deposition mask 20 may deviate from its expected value.

In the step of fixing the deposition mask 20 to the frame 15, the deposition mask 20 is stretched along the longitudinal direction D1 such that a plurality of the through-holes 25 in the deposition mask 20 are placed at their specified positions both along the longitudinal direction D1 and along the width direction D2. The amount of stretch of the deposition mask 20 along the longitudinal direction D1 may be determined in advance according to a simulation. In this case, during the step of fixing the deposition mask 20 to the frame 15, the deposition mask 20 is stretched along the longitudinal direction D1 by the predetermined amount of stretch.

Meanwhile, when stretched along the longitudinal direction D1, the deposition mask 20 contracts along the width direction D2. In the simulation, how much the deposition mask 20 is stretched during the step of fixing the deposition mask 20 to the frame 15 is determined on the basis of a correlation between the mount of stretch of the deposition mask 20 along the longitudinal direction D1 and the amount of contraction of the deposition mask 20 along the width direction D2. On the other hand, when there is a greater difference between the size of the through-hole 25 along the longitudinal direction D1 and the size of the through-hole 25 along the width direction D2, the aforementioned correlation will deviate from the one presumed in the simulation. If this is the case, stretching the deposition mask 20 along the longitudinal direction D1 by the amount of stretch determined in the simulation may cause a phenomenon in which the positions of the through-holes 25 in the deposition mask 20 along the width direction D2 deviate from their specified positions.

By using the aforementioned judgment condition D to evaluate the metal plate 64, the deposition mask 20 can be inhibited from being stretched by an amount deviating from the expected amount. As a result, the positions of the through-hole 25 can be adjusted to their specified positions by stretching the deposition mask 20 along the longitudinal direction D1 by the amount of stretch determined by a simulation. Specifically, as supported by Examples described later, the metal plate 64 was prepared such that a value obtained by dividing the first reflectance by the second reflectance was 0.70 or more and 1.30 or less, and then the deposition mask 20 produced by using the metal plate 64 was fixed to the frame 15. At that time, the deposition mask 20 was able to be stretched while the through-holes 25 were positioned in accordance with their specified position with respect to the longitudinal direction D1 and the width direction D2.

The metal plate 64 satisfying the judgment condition D can be produced by adjusting conditions for the rolling step among others so that the difference between the first reflectance and the second reflectance is smaller. The first reflectance is decreased when there is a greater difference between the surface roughness of a work roll or the rotation speed of a surface of the work roll and the transport speed of the metal plate 64. The second reflectance is dependent on, for example, the amount of a supplied rolling oil, the transport speed of the metal plate 64, the diameter of a work roll, and the rolling reduction rate of the metal plate 64. A work roll having a smaller diameter is effective in increasing the rolling reduction ratio of the metal plate 64. By adjusting conditions for the rolling step and other steps on the basis of these tendencies, the metal plate 64 having a smaller difference between the first reflectance and the second reflectance can be produced.

For the determining step in the inspection step, any combination of the aforementioned judgment conditions A to D may be used. For example, the metal plate 64 may be determined to be good when the metal plate 64 satisfies all the judgment conditions A to D or when the metal plate 64 satisfies at least one of the judgment conditions A to D. Examples of the combination are listed below.

Example 1: The metal plate 64 satisfying the judgment condition A is determined to be good.

Example 2: The metal plate 64 satisfying the judgment conditions A and B is determined to be good.

Example 3: The metal plate 64 satisfying the judgment conditions A, B, and C is determined to be good.

Example 4: The metal plate 64 satisfying the judgment conditions A and D is determined to be good.

Example 5: The metal plate 64 satisfying the judgment conditions A, B, and D is determined to be good.

Example 6: The metal plate 64 satisfying the judgment conditions A, B, C, and D is determined to be good.

Example 7: The metal plate 64 satisfying the judgment condition B is determined to be good.

Example 8: The metal plate 64 satisfying the judgment conditions B and C is determined to be good.

Example 9: The metal plate 64 satisfying the judgment conditions B and D is determined to be good.

Example 10: The metal plate 64 satisfying the judgment conditions B, C, and D is determined to be good.

Example 11: The metal plate 64 satisfying the judgment condition D is determined to be good.

Note that judgment criteria for the above-described judgment conditions A to D may be changed as appropriate depending on the characteristics the metal plate 64 is desired to have.

For example, the threshold of a surface reflectance for the judgment condition A may be any value in a range of 8% to a value lower than the threshold for the judgment condition B. For example, the threshold of a surface reflectance for the judgment condition A may be 10%, 12%, 14%, 16%, 18%, 20%, or 23%.

The threshold of a surface reflectance for the judgment condition B may be any value in a range of a value greater than the threshold for the judgment condition C to 25%. For example, the threshold of a surface reflectance for the judgment condition B may be 24% or 22%.

The threshold of a surface reflectance for the judgment condition C may be any value in a range of a value greater than the threshold for the judgment condition A to 20%. For example, the threshold of a surface reflectance for the judgment condition B may be 18%, 16%, 14%, 12%, or 10%

The lower limit of a value obtained by dividing the first reflectance by the second reflectance for the judgment condition D may be 0.75, 0.80, 0.85, 0.90, 0.95, 1.00, 1.05, 1.10, 1.15, 1.20, or 1.25. The upper limit of a value obtained by dividing the first reflectance by the second reflectance may be 1.25, 1.20, 1.15, 1.10, 1.05, 1.00, 0.95, 0.90, 0.85, 0.80, or 0.75.

Figure 20:
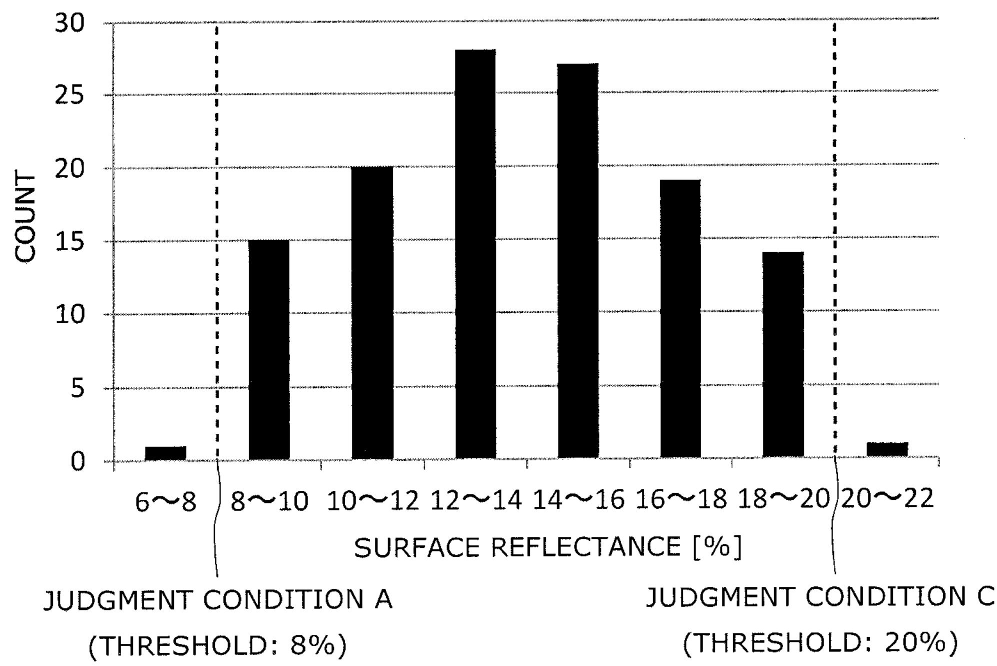
FIG. 20 shows an example distribution of surface reflectances of a plurality of metal plates that have been sorted out.

FIG. 20 shows an example distribution of surface reflectances of the metal plates 64 determined to be good and sorted out on the basis of the judgment conditions A, B, and C in Example 3 above. In FIG. 20, surface reflectance values of the individual metal plates 64 are taken along the horizontal axis. The number of the metal plates 64 falling in each of the ranges of surface reflectances indicated on the horizontal axis are taken along the vertical axis. For example, among the sorted-out metal plates 64, the number of the metal plates 64 having a surface reflectance of 12 to 14% is 28. In the example in FIG. 20, the threshold for the judgment condition A is 8% while the threshold for the judgment condition C is 20%. In this example, most (e.g., 95% or more) of the metal plates 64 determined to be good have a surface reflectance of 8 to 20%. As seen in FIG. 20, some of the sorted-out metal plates 64 may have a surface reflectance of less than 8% or greater than 20%, which is attributable to a measurement error, for example.

Figure 21:
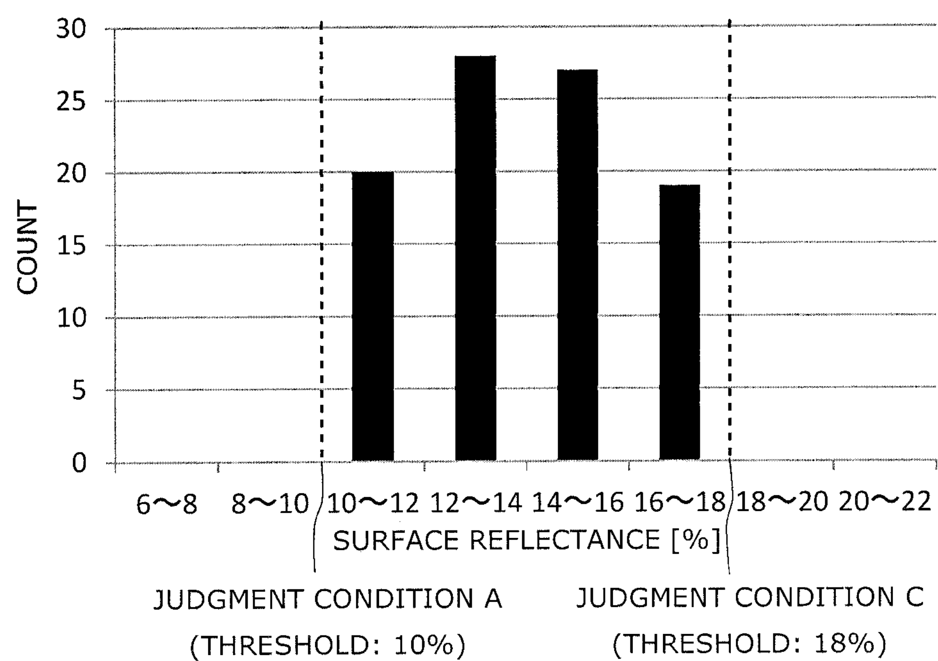
FIG. 21 shows an example distribution of surface reflectances of a plurality of metal plates that have been sorted out.

FIG. 21 shows an example distribution of surface reflectances of the metal plates 64 determined to be good and sorted out on the basis of the judgment conditions A, B, and C in Example 3 above. Explanations of the horizontal and vertical axes in FIG. 21 are the same as in FIG. 20. In the example in FIG. 21, the threshold for the judgment condition A is 10% while the threshold for the judgment condition C is 18%. Thus, the example in FIG. 21 shows that the metal plate 64 are sorted out as good in a narrower range than the example in FIG. 20. In this case, performing the screening in FIG. 21 includes performing the screening in FIG. 20.

In the examples described above, the inspection step of inspecting the metal plate 64 on the basis of a surface reflectance is performed for the purpose of determining each metal plate 64 to be good or not good, that is, for the purpose of screening the metal plates 64. In other words, in the examples above, the inspection step functions as a screening step of screening the metal plates 64 in a method for manufacturing the metal plates 64. In the examples illustrated in FIGS. 20 and 21, the screening step is performed to sort out the metal plates 64 that satisfy the judgment conditions A, B, and C, namely the conditions listed in Example 3 above. In short, in the illustrated examples above, the metal plates 64 having a surface reflectance of 8% to 25% are sorted out. However, the inspection step may be used for a purpose other than screening the metal plates 64 in a method for manufacturing the metal plates 64.

Note that any screening conditions may be used for the screening step. For example, during the screening step, the metal plates 64 satisfying all the judgment conditions A to D may be sorted out, or the metal plates 64 satisfying at least one of the judgment conditions A to D may be sorted out. Examples of combination are the same as Examples 1 to 11 described above for the determining step.

The following describes an example in which the inspection step is used for a purpose other than screening the metal plates 64 in a method for manufacturing the metal plate 64. For example, the inspection of the metal plate 64 on the basis of a surface reflectance may be utilized for optimizing conditions for manufacturing the metal plate 64, including conditions for the rolling step, the annealing step, and so on. In a specific example, first, the metal plates 64 are manufactured under various conditions and surface reflectances of the obtained metal plates 64 are calculated. Then, the rolling conditions are associated with surface reflectances of the obtained metal plates 64. This results in finding a rolling condition for manufacturing the metal plates 64 that are highly likely to satisfy the aforementioned judgment conditions. In this way, the inspection of the metal plates 64 on the basis of a surface reflectance may be utilized for finding a suitable rolling condition. In this case, it is not necessary to perform the inspection step to calculate surface reflectances for all the metal plates 64 obtained in the actual manufacturing steps. For example, the inspection step may be performed on some of the metal plates 64. Alternatively, once manufacturing conditions including rolling conditions are set, the inspection step of calculating surface reflectances may not be performed at all.

Figure 22:
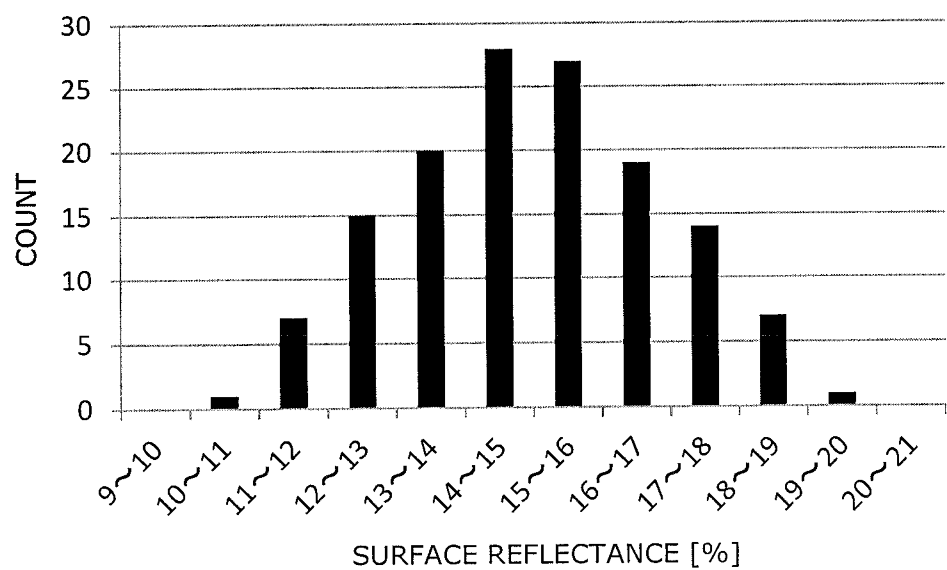
FIG. 22 shows an example distribution of surface reflectances of a plurality of metal plates that have been manufactured.

FIG. 22 shows an example distribution of surface reflectances of the metal plates 64 that have been manufactured in accordance with the rolling and annealing conditions identified by utilizing the judgment conditions A and C. Explanations of the horizontal and vertical axes in FIG. 22 are the same as in FIG. 20. In the example in FIG. 22, the threshold for the judgment condition A is 8% while the threshold for the judgment condition C is 20%. The example in FIG. 22 shows that each of the manufactured metal plates 64 has a surface reflectance of 8% to 20% although the screening step is omitted.

After the rolling step or the annealing step, an appearance inspection step may be performed to inspect the appearance of the metal plate 64. The appearance inspection step may include a step of inspecting the appearance of the metal plate 64 using an automatic tester. The appearance inspection step may include a step of visually inspecting the appearance of the metal plate 64.

After the rolling step or the annealing step, a shape inspection step may be performed to inspect the shape of the metal plate 64. For example, a surface position of the metal plate 64 with respect to the thickness direction may be measured within a certain region of the metal plate 64 by using a three-dimensional measuring apparatus.

The method for manufacturing the metal plate according to the present embodiment provides the metal plate 64 satisfying the aforementioned judgment conditions. For example, the metal plate 64 having a surface reflectance of 8% or higher can be obtained. This allows the light reflectance of a surface of the metal plate 64 to be significantly higher than the light reflectance of an alignment mark including a dent of a surface of the metal plate 64. As a result, failures in detecting an alignment mark can be reduced. In addition, the metal plate 64 having a surface reflectance of 25% or lower, more preferably 20% or lower, can be obtained. This enables a resist film to more firmly adhere to a surface of the metal plate 64, whereby a resist pattern having a narrow width can be stably provided on a surface of the metal plate 64. Therefore, the deposition mask 20 for producing an organic EL display device having a high pixel density can be stably obtained. Furthermore, the metal plate 64 having a value of 0.70 or more and 1.30 or less obtained by dividing the first reflectance by the second reflectance can be provided. As a result, during the step of fixing the deposition mask 20 manufactured by using the metal plate 64 to the frame 15, when the deposition mask 20 is stretched along the longitudinal direction D1 so that the through-holes 25 are placed at their specified position along the longitudinal direction D1, the through-holes 25 can be inhibited from deviating from their specified positions along the width direction D2.

Mainly referring to FIGS. 10 to 15, the following describes a method for manufacturing the deposition mask 20 using the metal plate 64 having a surface reflectance satisfying any of the aforementioned judgment conditions.

Figure 10:
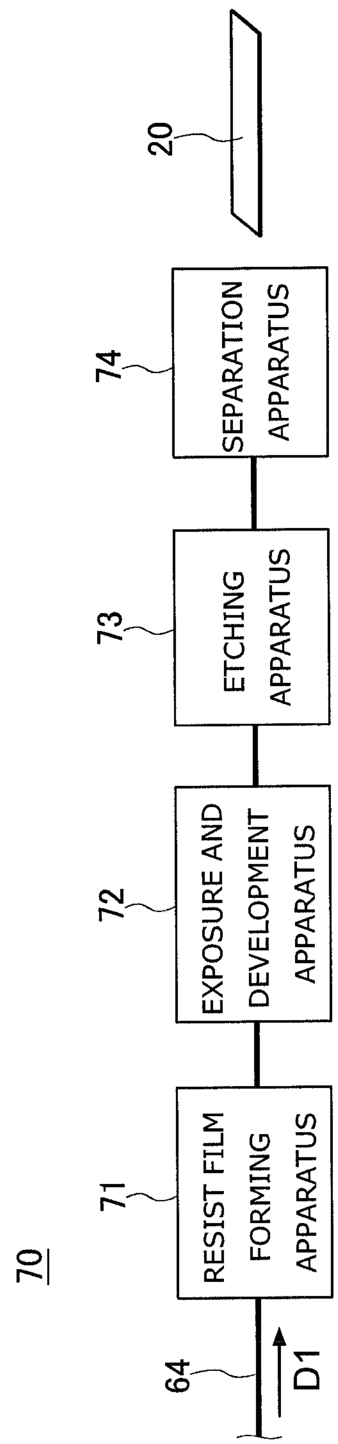
FIG. 10 is a schematic view for generally explaining an example of a manufacturing method for the deposition mask.

FIG. 10 illustrates a manufacturing apparatus 70 for manufacturing the deposition mask 20 using the metal plate 64. First, the metal plate 64 elongated along the longitudinal direction D1 is prepared. For example, the metal plate 64 is prepared in the form of the winding body 62 in which the metal plate 64 is wound around the core 61 as mentioned above. Next, the metal plate 64 is transported to a resist film forming apparatus 71, an exposure and development apparatus 72, an etching apparatus 73, and a separation apparatus 74 in this order, as illustrated in FIG. 10. Note that FIG. 10 illustrates an example in which the metal plate 64 is transported in its longitudinal direction D1 to move between the apparatuses, but this is not restrictive. For example, a resist film is formed by the resist film forming apparatus 71 on the metal plate 64, which may then be wound around the core, and the metal plate 64 in the form of a winding body may be fed to the exposure and development apparatus 72. Alternatively, the metal plate 64 with a resist film formed thereon is exposed and developed in the exposure and development apparatus 72, and then the metal plate 64 may be wound around the core and the metal plate 64 in the form of a winding body may be fed to the etching apparatus 73. Alternatively, the metal plate 64 that has been etched in the etching apparatus 73 may be wound around the core, and then the metal plate 64 in the form of a winding body may be fed to the separation apparatus 74.

The resist film forming apparatus 71 disposes a resist film on a surface of the metal plate 64. The exposure and development apparatus 72 exposes and develops the resist film for patterning the resist film to form a resist pattern.

The etching apparatus 73 etches the metal plate 64 with the resist pattern serving as a mask to create the through-holes 25 in the metal plate 64. In the present embodiment, a large number of through-holes 25 corresponding to a plurality of the deposition masks 20 are created in the metal plate 64. In other words, a plurality of the deposition masks 20 are assigned to the metal plate 64. For example, a large number of through-holes 25 are created in the metal plate 64 such that a plurality of the effective areas 22 are arranged along the width direction D2 of the metal plate 64, and the effective areas 22 for a plurality of the deposition masks 20 are arranged along the longitudinal direction D1 of the metal plate 64.

The separation apparatus 74 is used to perform the separation step of separating a portion of the metal plate 64 forming the through-holes 25 corresponding to a single deposition mask 20 is separated from the metal plate 64. In this way, the deposition mask 20 being sheet-like can be obtained.

Figure 11:
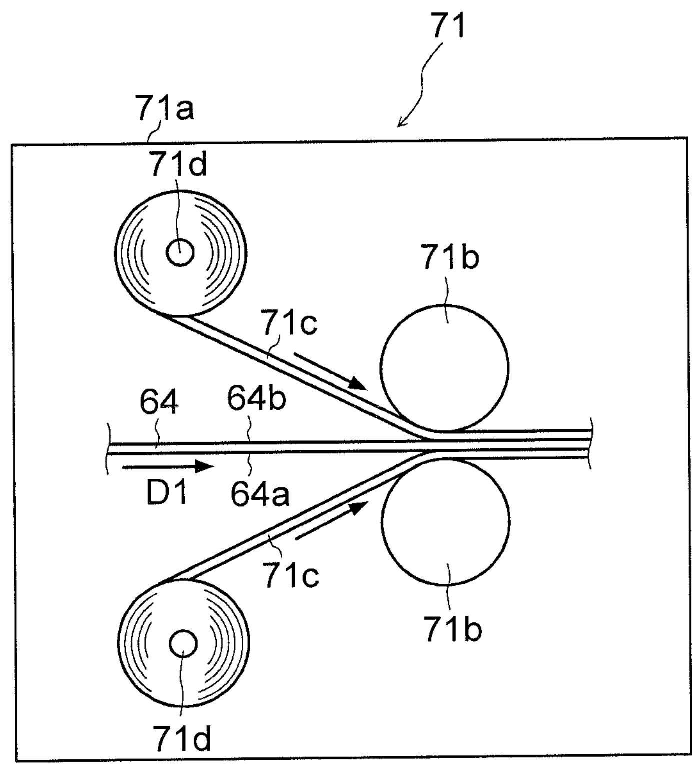
FIG. 11 is a view showing a step of disposing a resist film on the metal plate.
Figure 12:
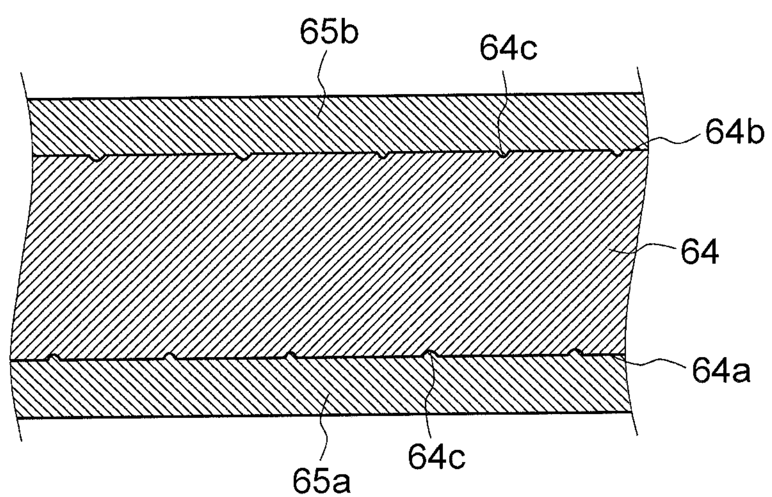
FIG. 12 is an enlarged sectional view of the metal plate on which resist films are disposed.

Referring to FIGS. 11 and 12, the following describes a resist film forming step of disposing a resist film on a surface of the metal plate 64 using the resist film forming apparatus 71.

As shown in FIG. 11, the resist film forming apparatus 71 includes a chamber 71*a*, a laminating roller 71*b* located inside the chamber 71*a*, and air evacuating means (not illustrated). The air evacuating means is capable of discharging air from the chamber 71*a* to make the pressure in the chamber 71*a* lower than the atmospheric pressure.

As illustrated in FIG. 11, during the resist film forming step, a dry film 71*c* is layered on a surface of the metal plate 64, and the laminating roller 71*b* is used to press the dry film 71*c* against the metal plate 64. In this way, the resist film that forms a layer in the dry film 71*c* facing the metal plate 64 can be attached to a surface of the metal plate 64. In addition, since the pressure in the chamber 71*a* is kept lower than the atmospheric pressure as described above, air bubbles and the like are prevented from forming between a surface of the metal plate 64 and the resist film. The resist film is a film containing a photosensitive resist material, examples of which include an acrylic photo-curable resin.

The laminating roller 71*b* may press the dry film 71*c* containing a resist film against the metal plate 64 while heating the dry film 71*c*. Some examples of laminating conditions for the resist film forming step are listed below.

Pressure in the chamber 71*a:* 10 Pa or more and 1,000 Pa or less

Temperature of the laminating roller 71*b:* 90° C. or more and 130° C. or less Pressure applied by the laminating roller 71*b:* 0.2 MPa or more and 0.5 Mpa or less As illustrated in FIG. 11, the dry film 71*c* may be fed from the core 71*d* located inside the chamber 71*a*, around which core 71*d* the dry film 71*c* is wound. Likewise, although not illustrated, the metal plate 64 may be fed from a core located inside the chamber 71*a*, around which core the metal plate 64 is wound.

FIG. 12 is a sectional view of a laminated body including the metal plate 64, the first resist film 65*a* disposed on the first surface 64*a* of the metal plate 64, and the second resist film 65*b* disposed on the second surface 64*b* of the metal plate 64. In the example illustrated in FIG. 12, a dent 64*c* is created on, for example, the first surface 64*a* of the metal plate 64. The dent 64*c* may be an oil pit, for example. According to the example illustrated in FIG. 12, the resist films 65*a* and 65*b* enter the inside of each dent 64*c*, whereby the areas of the resist films 65*a* and 65*b* in contact with a surface of the metal plate 64 are larger than those in contact with a surface of the metal plate 64 having no dent 64*c*. This enables the resist films 65*a* and 65*b* to more firmly adhere to a surface of the metal plate 64. In addition, according to the present embodiment, information pertaining to the density of the dents 64*c* distributed over a surface of the metal plate 64 can be obtained on the basis of light reflectances of a surface of the metal plate 64.

Next, the resist films 65*a* and 65*b* are exposed and developed by using the exposure and development apparatus 72. Accordingly, as shown in FIG. 13, a first resist pattern 65*c* can be formed on the first surface 64*a* of the metal plate 64, and a second resist pattern 65*d* can be formed on the second surface 64*b* of the metal plate 64.

Figure 13:
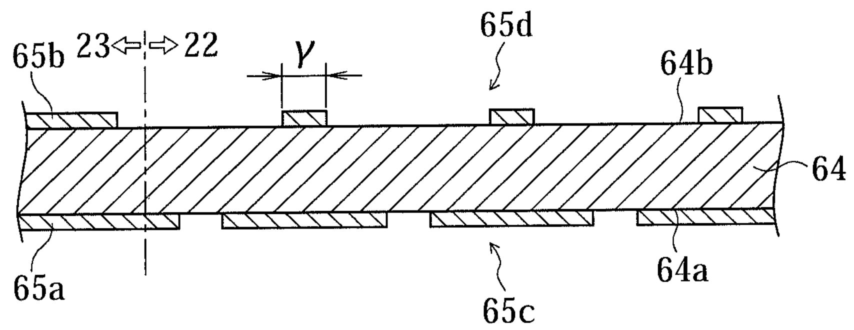
FIG. 13 is a view showing a step of patterning a resist film.

In FIG. 13, the symbol γ represents the width of the second resist pattern 65*d* covering the aforementioned top portion 43 of the deposition mask 20 to be formed in the second surface 64*b* of the metal plate 64. The width γ is 40 μm or less, for example. The width γ may be 5 μm or greater.

Figure 14:
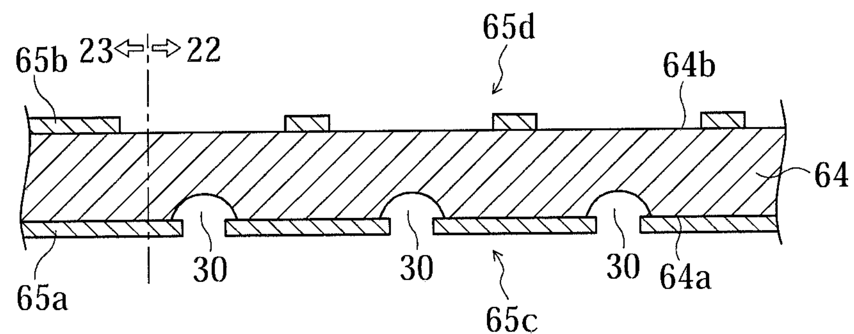
FIG. 14 is a view showing a step of etching a first surface.

Then, the metal plate 64 is etched by using the etching apparatus 73 with the resist patterns 65*c* and 65*d* serving as masks. Specifically, as shown in FIG. 14, the etching step begins with etching the first surface 64*a* of the metal plate 64 in the areas not covered with the first resist pattern 65*c* by using a first etchant. For example, the first etchant is ejected from a nozzle, which is disposed on the side facing the first surface 64*a* of the transported metal plate 64, toward the first surface 64*a* of the metal plate 64 over the first resist pattern 65*c*. As a result, as shown in FIG. 14, areas of the metal plate 64, which are not covered with the first resist pattern 65*c*, are eroded by the first etchant. Thus, a lot of first recesses 30 are formed in the first surface 64*a* of the metal plate 64. Examples of the first etchant to be used include an etchant containing ferric chloride solution and hydrochloric acid.

Figure 15:
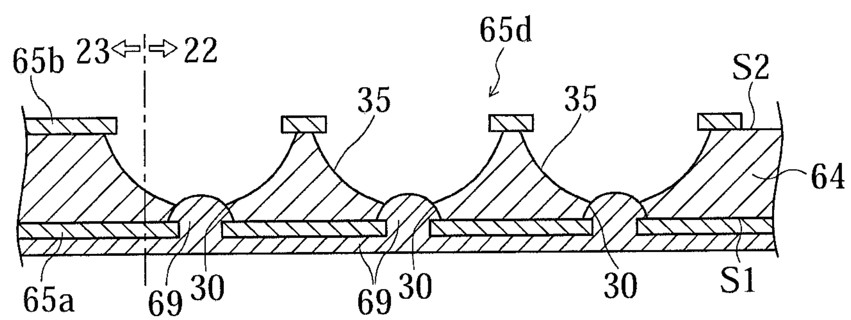
FIG. 15 is a view showing a step of etching a second surface.

Then, as illustrated in FIG. 15, areas of the second surface 64*b* of the metal plate 64, which are not covered with the second resist pattern 65*d*, are etched to form second recesses 35 in the second surface 64*b*. The etching of the second surface 64*b* is performed until each first recess 30 and each second recess 35 communicate with each other so that the through-hole 25 is formed. As with the foregoing first etchant, examples of the second etchant to be used include an etchant containing ferric chloride solution and hydrochloric acid. As illustrated in FIG. 15, during the etching of the second surface 64*b*, each of the first recesses 30 may be covered with a resin 69 that is resistant to the second etchant.

The resin 69 is removed from the metal plate 64 later. For example, the resin 69 can be removed by using an alkali-based peeling liquid. When the alkali-based peeling liquid is used, the resist patterns 65*c* and 65*d* are removed simultaneously with the removal of the resin 69. However, after the removal of the resin 69, the resist patterns 65*c* and 65*d* may be removed separately from the resin 69 by using a peeling liquid different from the one for removing the resin 69.

Then, the plurality of the deposition mask 20 assigned to the metal plate 64 are taken out one by one. For example, a portion of the metal plate 64 forming the through-holes 25 corresponding to a single deposition mask 20 is separated from the other portions of the metal plate 64. In this way, the deposition mask 20 can be obtained.

Next, the inspection step is performed to check whether a deviation of the area of each through-hole 25 formed in the metal plate 64 from a reference value is equal to or less than a predetermined permissible value. In the inspection step, parallel light rays along a normal direction to the metal plate 64 are caused to enter one of the first surface 20*a* and the second surface 20*b* of the deposition mask 20, pass through the through-holes 25, and come out from the other one of the first surface 20*a* and the second surface 20*b*. The area of each through-hole 25 is measured by obtaining the area of a region occupied along a plane direction of the metal plate 64 by the outgoing light rays. In the present embodiment, the connection portion 41 between the first recess 30 and the second recess 35 determines the area of a region occupied along a plane direction of the metal plate 64 by the light rays outgoing from the deposition mask 20. In other words, in the present embodiment, the area of a region surrounded by the connection portion 41 corresponds to the area of each through-hole 25 as measured in the inspection step. The reference value and the permissible value are set in accordance with factors including a pixel density of a display device to be manufactured by using the deposition mask 20. The permissible value may be, for example, a predetermined value falling within a range of 5 $\mu m^2$ or higher and 400 $\mu m^2$ or lower. The permissible value may be 20 $\mu m^2$ or higher. In the step of inspecting the through-holes, when the deposition mask 20 includes at least one through-hole 25 whose area deviates from the reference value by an amount exceeding the permissible value, the deposition mask 20 is rejected as nonconforming.

Figure 16:
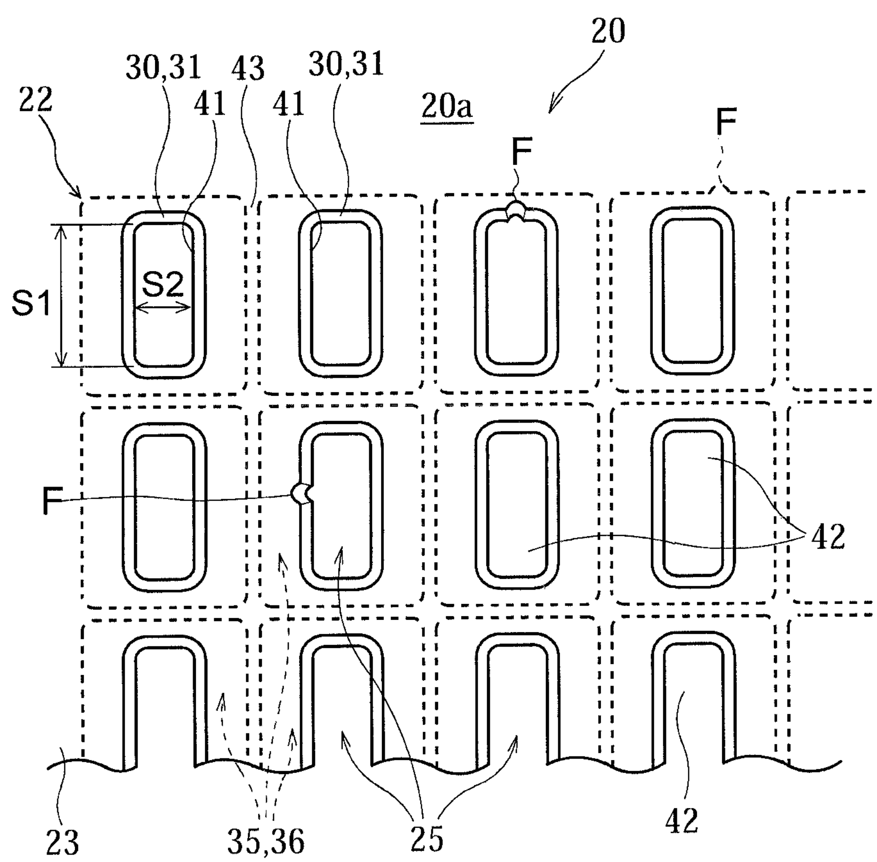
FIG. 16 is a view for explaining a method for inspecting the area of a through-hole in the deposition mask.

FIG. 16 is an example plan view of the deposition mask 20 as seen from the first surface 20*a* side. As shown in FIG. 16, the contour of the through-hole 25 including the first recess 30 may include a chipped portion F formed by breaking off part of a surface of the metal plate 64. Such chipped portion F is a cause of a deviation of the area of the through-hole 25 from the reference area value. The chipped portion F may be formed by an etchant entering a space between a surface of the metal plate 64 and the resist pattern 65*c* or 65*d* because of lower adhesion of the resist pattern 65*c* or 65*d* to the surface of the metal plate 64.

The inspection step may include checking whether the variation in areas of the through-holes 25 formed in the metal plate 64 is equal to or less than a predetermined permissible value. For example, it may be checked whether the difference between the areas of adjacent two through-holes 25 is equal to or less than a predetermined permissible value.

The size measuring step may also be performed to measure dimensions of the through-hole 25 formed in the metal plate 64. Examples of the dimensions of the through-hole 25 include a size S1 and a size S2 of the connection portion 41 along the directions in which a plurality of the through-holes 25 are arranged, as shown in FIG. 16. Dimensions of the through-hole 25 can be measured by using a measuring instrument such as AMIC-1710D made by Sinto S-Precision, Ltd. The size measuring step may include checking whether a deviation of the measured size from a size reference value is equal or less than a predetermined permissible value. The permissible value for dimensions may be, for example, 3.0 μm, 2.0 μm, or 1.5 μm. The amount of a deviation of the measured size from a size reference value is greater as the resist pattern 65*c*, 65*d* adheres to a surface of the metal plate 64 less firmly.

However, in the present embodiment, the resist patterns 65*c* and 65*d* can adhere to surfaces of the metal plate 64 more firmly by using the metal plate 64 that satisfies the aforementioned judgment conditions B and C, for example, as described above. Hence, an etchant can be inhibited from entering a space between a surface of the metal plate 64 and the resist patterns 65*c* and 65*d*. As a result, the through-hole 25 can have its area and dimensions deviating from reference values to a smaller extent. In addition, the adhesion of the resist patterns 65*c* and 65*d* to a surface of the metal plate 64 varies with the position to a smaller extent. As a result, the degree of variation in areas and sizes of the through-holes 25 can be made smaller.

Note that when the metal plate 64 satisfying both the judgment condition A and the judgment condition B is used for manufacturing the deposition mask 20, the deposition mask 20 can also satisfy these judgment condition A and judgment condition B. For example, the deposition mask 20 includes portions that have no through-hole 25 formed and are covered with resist patterns during the step of manufacturing the deposition mask 20, such as the tabs 17*a* and 17*b* of the deposition mask 20 and the peripheral area 23 in the middle portion 18. These portions do not make contact with any etchant during the manufacturing step. Thus, surfaces of the metal plate 64 at the tabs 17*a* and 17*b* and the peripheral area 23 can be kept unchanged irrelevant to any through-hole 25 being formed. Therefore, when a surface reflectance of the metal plate 64 forming the deposition mask 20 is measured by irradiating the tabs 17*a* and 17*b* or the peripheral area 23 of the deposition mask 20 with light, the measured reflectance may satisfy the aforementioned judgment condition A and the judgment condition B. Likewise, the deposition mask 20 may satisfy the aforementioned judgment condition C. Likewise, the deposition mask 20 may satisfy the aforementioned judgment condition D.

Next, a welding step is performed to weld the deposition mask 20 obtained as above to the frame 15. In this way, the deposition mask apparatus 10 including the deposition mask 20 and the frame 15 can be obtained.

Figure 17A:
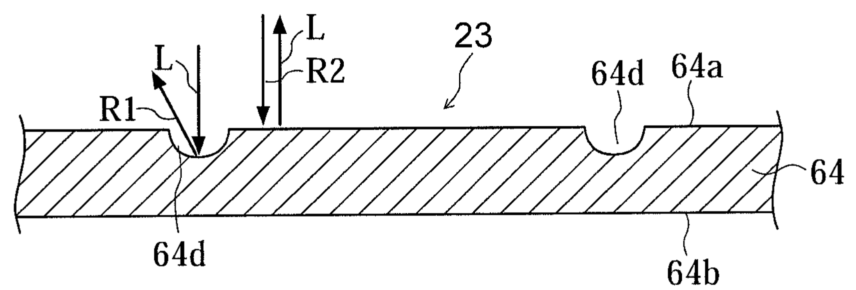
FIG. 17A is a sectional view showing an example of an alignment mark on the deposition mask.

The welding step may include aligning the deposition mask 20 with the frame 15 utilizing alignment marks formed on the deposition mask 20. FIG. 17A is a sectional view showing an example of the alignment mark 64*d*. In the example illustrated in FIG. 17A, the alignment mark 64*d* is made of a recess that is formed in the peripheral area 23 of the deposition mask 20 on the first surface 64*a* of the metal plate 64. For example, the recess is formed simultaneously when the first recess 30 is formed during the etching step by etching the metal plate 64 from the first surface 64*a* side to form the first recess 30. In this case, the etching step is performed so that the recess forming the alignment mark 64*d* does not pass through the second surface 64*b*.

The light entering the alignment mark 64*d* is reflected at an angle different from the angle of the incident light L, as indicated by the arrow with the symbol R1 in FIG. 17A. For example, assuming that the incident light L is incident on the first surface 64*a* at an incident angle of 90°, the reflected light R1 comes out from the alignment mark 64*d* at an outgoing angle deviated from 90°. Therefore, a detector configured to detect the reflected light R2 from around the alignment mark 64*d* will fail to correctly detect the reflected light R1 from the alignment mark 64*d*. As a result, the alignment mark 64*d* is recognized as an area having a smaller amount of detected light than other areas therearound on the first surface 64*a*. For example, the alignment mark 64*d* is recognized as a black area.

Figure 17B:
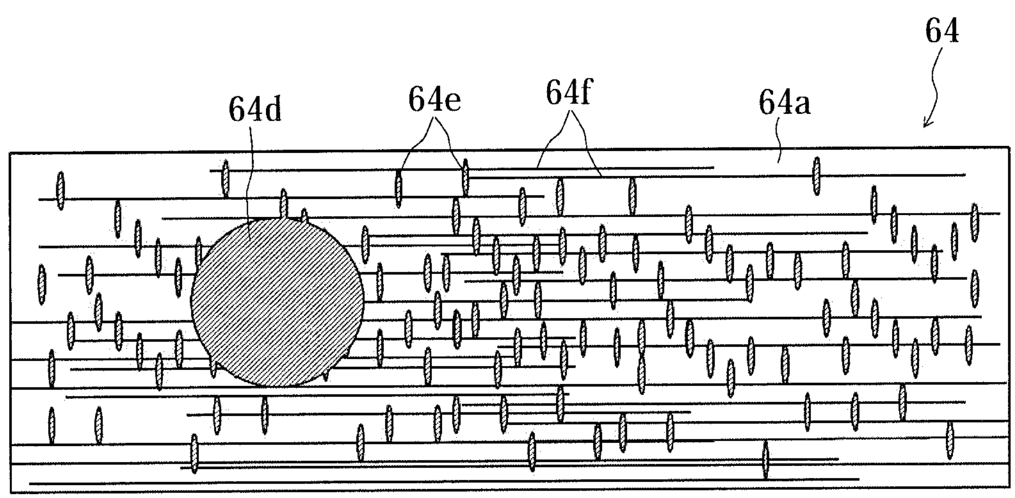
FIG. 17B is a schematic view showing an example image obtained by taking an image of alignment marks on the deposition mask.

FIG. 17B is a schematic view showing an example image obtained by taking an image of the alignment mark 64*d* on the deposition mask 20. As described above, the incident light is reflected from the alignment mark 64*d* at an angle different from the angle at which the incident light is incident on the alignment mark 64*d*. As a result, the alignment mark 64*d* is recognized as a black area. Likewise, the oil pits 64*e* and the rolling streaks 64*f* are recognized as black areas. Thus, when a large number of oil pits 64*e* and rolling streaks 64*f* are present, the alignment mark 64*d* may be detected more erroneously because the oil pits 64*e* and the rolling streaks 64*f* are recognized as part of the contour of the alignment mark 64*d*.

The present inventors have conducted extensive studies to find that the alignment mark 64*d* could not be correctly detected when the surface reflectance of the first surface 64*a* of the metal plate 64 was less than 8%, as described later in Examples. A possible reason therefor is that not only the alignment mark 64*d* but also areas around the alignment mark 64*d* on the first surface 64*a* were recognized as black areas, and thus the contour of the alignment mark 64*d* could not be detected. Another possible reason is that, when the surface reflectance of the first surface 64*a* of the metal plate 64 was less 8% due to oil pits and the like, the oil pits were erroneously recognized as the black area that defines the contour of the alignment mark 64*d*. In the present embodiment, the metal plate 64 that satisfies the aforementioned judgment condition A is used, which ensures that the reflected light R2 from around the alignment mark 64*d* has a sufficiently high intensity. As a result, the position and contour of the alignment mark 64*d* can be identified with high precision on the basis of a difference between detected amounts of reflected light.

The aforementioned embodiment can be variously modified. Herebelow, modification examples are described with reference to the drawings according to need. In the below description and the drawings used in the below description, a part that can be similarly constituted to the above embodiment has the same symbol as that of corresponding part of the above embodiment, and overlapped description is omitted. In addition, when the effect obtained by the aforementioned embodiment is apparently obtained in the modification examples, description thereof is possibly omitted.

In the example illustrated in the present embodiment above, the metal plate 64 is obtained by rolling a base metal. However, this is not restrictive, and a metal plate 64 having a desired thickness may be manufactured by a foil creating step utilizing a plating process. In the foil creating step, for example, while a drum made of stainless, which is partially immersed in a plating liquid, is rotated, a plating film is formed on a surface of the drum. By peeling off the plating film, an elongated metal plate can be manufactured in a roller-to-roller manner. When a metal plate is manufactured of an iron alloy containing nickel, a mixture solution of a solution containing a nickel compound and a solution of an iron compound may be used as a plating liquid. For example, a mixture solution of a solution containing nickel sulfamate and a solution containing iron sulfamate may be used. An additive may be contained in the plating liquid. Examples of the additive include boric acid serving as a buffer agent, saccharin or malonic acid serving as a smoothing agent, and sodium dodecyl sulfate serving as a surfactant.

Then, the aforementioned annealing step may be performed to the metal plate obtained in this manner. In addition, before or after the annealing step, there may be performed the aforementioned slitting step of cutting off both ends of the metal plate, so as to adjust the width of the metal plate into a desired width.

In the case of utilizing the plating process to produce the metal plate 64, the metal plate 64 is manufactured such that its surface reflectance satisfies the aforementioned judgment conditions as in the present embodiment above. For example, some conditions are adjusted including the concentration of the aforementioned additive contained in the plating liquid and the temperature and duration for the foil creating step. As a result, a resist film can more firmly adhere to a surface of the metal plate 64 while alignment marks formed on the metal plate 64 remain detectable.

In the example illustrated in the present embodiment above, the deposition mask 20 is manufactured by etching the metal plate 64 to create the through-holes 25 in the metal plate 64. However, this is not restrictive, and the deposition mask 20 may be manufactured by forming a plating layer on the substrate in a predetermined pattern corresponding to the through-holes 25 and peeling off the plating layer from the substrate. A method for manufacturing such deposition mask 20 is disclosed in, for example, JP2016-148112A, and thus detailed description thereof is omitted here.

In the example illustrated in the present embodiment above, the inspection step of measuring surface reflectances to inspect surfaces of the metal plate 64 is performed on the metal plate 64 in which the through-holes 25 are not created yet. However, this is not restrictive, and the inspection step of measuring surface reflectances to inspect surfaces of the metal plate 64 may be performed on the metal plate 64 in which the through-holes 25 have been created. In other words, the inspection step may be performed on the deposition mask 20. In this case, surface reflectances of a portion of the metal plate 64 forming the deposition mask 20 can be measured by irradiating with light a portion of the metal plate 64 having no through-hole 25 formed therein and having an area of a predetermined size. For example, a portion of the metal plate 64 forming the tab 17*a* or 17*b* of the deposition mask 20 or forming the peripheral area 23 in the middle portion 18 may be irradiated with light.

EXAMPLES

Embodiments of the present disclosure will now be described in more detail by way of examples, but the embodiments of the present disclosure are not limited to the descriptions of examples below as long as the embodiments do not depart from the spirit thereof.

Example 1

A base metal made of an iron alloy containing 36% by mass of nickel, balancing iron, and unavoidable impurities was prepared. Then, the base metal was subjected to the rolling step, the slitting step, and the annealing step described above, so that a winding body (a 1st winding body) around which the metal plate 64 having a thickness of 15 μm was wound was manufactured. Then, the aforementioned first specimen 50L, second 50M, and third specimen 50R were taken from the 1st winding body.

Next, a first reflectance and a second reflectance of a surface (the first surface 64*a* in this example) of each of the specimens 50L, 50M, and 50R were measured. The measurement results of the first and second reflectances of the specimen 50L were 22.7% and 23.6%, respectively. The first and second reflectances of the specimen 50M were 23.0% and 23.6%, respectively. The first and second reflectances of the specimen 50R were 23.1% and 22.6%, respectively. A first reflectance and a second reflectance of the second surface 64*b* of each of the specimens 50L, 50M, and 50R were also measured to obtain the results similar to those of the first surface 64*a*.

As an instrument for measuring reflectances, the Gonio Photometer GP-200 made by Murakami Color Research Laboratory was used. As a light source, a halogen lamp capable of outputting 50 W (12 V) was used. The light emitted by the light source was passed through a neutral density filter (ND-10) and caused to be incident on the individual specimens 50L, 50M, and 50R. As apertures, an iris diaphragm having a diameter of 14.0 mm was used on the light source side, while an aperture diaphragm having a diameter of 11.4 mm was used on the detector side. During the measurement, intensities of the reflected light outgoing at an angle of 30° to 60° from a surface of the specimen 50 were measured at 0.1° intervals by changing the angle or position of the detector. The aforementioned first reflectance and second reflectance were calculated by using the measurement results corresponding to the reflected light falling within 45°±0.2°.

The calculated surface reflectance, which was an average of the first reflectance and the second reflectance of each of the specimens 50L, 50M, and 50R, was 23.1%. Thus, the 1st winding body satisfied the above-mentioned judgment conditions A and B, but did not satisfy the above-mentioned judgment condition C.

A value obtained by dividing the first reflectance by the second reflectance (=1st reflectance/2nd reflectance) was calculated for each of the specimens 50L, 50M, and 50R. The results were 0.96, 0.98, and 1.02, respectively. Thus, the 1st winding body satisfied the above-mentioned judgment condition D.

Example 2

The rolling step, the slitting step, and the annealing step described above were performed on the base metal made of an iron alloy containing 36% by mass of nickel, balancing iron, and unavoidable impurities, so that a winding body (a 2nd winding body) around which the metal plate 64 having a thickness of 15 μm was wound was manufactured. Conditions for manufacturing the 2nd winding body were substantially the same as the conditions for manufacturing the 1st winding body, but were different in details.

As in Example 1 above, a first reflectance and a second reflectance of each of the specimens 50L, 50M, and 50R taken from the second winding body were measured. The surface reflectance was calculated as an average of the first reflectance and the second reflectance. A value obtained by dividing the first reflectance by the second reflectance was calculated for each of the specimens 50L, 50M, and 50R. The results are shown in FIG. 18A. In FIG. 18A, "L" in the "Measurement position" column represents the measurement result of the first specimen 50L, "M" represents the measurement result of the second specimen 50M, and "R" represents the measurement result of the third specimen 50R.

Examples 3 to 6

The rolling step, the slitting step, and the annealing step described above were performed on the base metal made of an iron alloy containing 36% by mass of nickel, balancing iron, and unavoidable impurities, so that a 3rd winding body, a 4th winding body, a 5th winding body, and a 6th winding body, each having the metal plate 64 being 18 μm thick wound therearound were manufactured. Conditions for manufacturing the 3rd to 6th winding bodies were substantially the same but were different in details. Conditions for manufacturing the 5th winding body (the work roll diameter, the amount of a supplied rolling oil (coolant), and the rolling speed) were the same as the conditions for manufacturing the above-mentioned 1st winding body.

As in Example 1 above, a first reflectance and a second reflectance of each of the specimens 50L, 50M, and 50R taken from the 3rd to 6th winding bodies were measured. The surface reflectance was obtained by calculating an average of the first reflectance and the second reflectance. A value obtained by dividing the first reflectance by the second reflectance was calculated for each of the specimens 50L, 50M, and 50R. The results are shown in FIG. 18A.

Examples 7 to 12

The rolling step, the slitting step, and the annealing step described above were performed on the base metal made of an iron alloy containing 36% by mass of nickel, balancing iron, and unavoidable impurities, so that a 7th winding body, an 8th winding body, a 9th winding body, a 10th winding body, an 11th winding body, and a 12th winding body each having the metal plate 64 being 20 μm thick wound therearound were manufactured. Conditions for manufacturing the 7th to 12th winding bodies were substantially the same but were different in details. Conditions for manufacturing the 9th winding body were the same as the conditions for manufacturing the 1st to 5th winding bodies described above. Conditions for manufacturing the 8th winding body were the same as the conditions for manufacturing the 4th winding body described above. Conditions for manufacturing the 11th winding body were the same as the conditions for manufacturing the 6th winding body described above.

As in Example 1 above, a first reflectance and a second reflectance of each of the specimens 50L, 50M, and 50R taken from the 7th to 12th winding bodies were measured. The surface reflectance was calculated as an average of the first reflectance and the second reflectance. A value obtained by dividing the first reflectance by the second reflectance was calculated for each of the specimens 50L, 50M, and 50R. The results are shown in FIG. 18A.

Examples 13 to 16

The rolling step, the slitting step, and the annealing step described above were performed on the base metal made of an iron alloy containing 36% by mass of nickel, balancing iron, and unavoidable impurities, so that a 13th winding body, a 14th winding body, a 15th winding body, and a 16th winding body, each having the metal plate 64 being 25 μm thick wound therearound were manufactured. Conditions for manufacturing the 13th to 16th winding bodies were substantially the same but were different in details. Conditions for manufacturing the 13th winding body were the same as the conditions for manufacturing the 4th to 8th winding bodies described above. Conditions for manufacturing the 15th winding body were the same as the conditions for manufacturing the 6th and 11th winding bodies described above.

As in Example 1 above, a first reflectance and a second reflectance of each of the specimens 50L, 50M, and 50R taken from the 13th to 16th winding bodies were measured. The surface reflectance was calculated as an average of the first reflectance and the second reflectance. The results are shown in FIG. 18B.

Examples 17 and 18

The rolling step, the slitting step, and the annealing step described above were performed on the base metal made of an iron alloy containing 36% by mass of nickel, balancing iron, and unavoidable impurities, so that a 17th winding body and an 18th winding body, each having the metal plate 64 being 30 μm thick wound therearound were manufactured. Conditions for manufacturing the 17th and 18th winding bodies were substantially the same but were different in details.

As in Example 1 above, a first reflectance and a second reflectance of each of the specimens 50L, 50M, and 50R taken from the 17th and 18th winding bodies were measured. The surface reflectance was calculated as an average of the first reflectance and the second reflectance. A value obtained by dividing the first reflectance by the second reflectance was calculated for each of the specimens 50L, 50M, and 50R. The results are shown in FIG. 18B.

Examples 19 and 20

The rolling step, the slitting step, and the annealing step described above were performed on the base metal made of an iron alloy containing 36% by mass of nickel, balancing iron, and unavoidable impurities, so that a 19th winding body and a 20th winding body, each having the metal plate 64 being 35 μm thick wound therearound were manufactured. Conditions for manufacturing the 19th and 20th winding bodies were substantially the same but were different in details.

As in Example 1 above, a first reflectance and a second reflectance of each of the specimens 50L, 50M, and 50R taken from the 19th and 20th winding bodies were measured. The surface reflectance was calculated as an average of the first reflectance and the second reflectance. A value obtained by dividing the first reflectance by the second reflectance was calculated for each of the specimens 50L, 50M, and 50R. The results are shown in FIG. 18B.

Examples 21 and 22

The rolling step, the slitting step, and the annealing step described above were performed on the base metal made of an iron alloy containing 36% by mass of nickel, balancing iron, and unavoidable impurities, so that a 21st winding body and a 22nd winding body, each having the metal plate 64 being 40 μm thick wound therearound were manufactured. Conditions for manufacturing the 21st and 22nd winding bodies were substantially the same but were different in details.

As in Example 1 above, a first reflectance and a second reflectance of each of the specimens 50L, 50M, and 50R taken from the 21st and 22nd winding bodies were measured. The surface reflectance was calculated as an average of the first reflectance and the second reflectance. A value obtained by dividing the first reflectance by the second reflectance was calculated for each of the specimens 50L, 50M, and 50R. The results are shown in FIG. 18B.

Examples 23 and 24

The rolling step, the slitting step, and the annealing step described above were performed on the base metal made of an iron alloy containing 36% by mass of nickel, balancing iron, and unavoidable impurities, so that a 23rd winding body and a 24th winding body, each having the metal plate 64 being 100 μm thick wound therearound were manufactured. Conditions for manufacturing the 23rd and 24th winding bodies were substantially the same but were different in details.

As in Example 1 above, a first reflectance and a second reflectance of each of the specimens 50L, 50M, and 50R taken from the 23rd and 24th winding bodies were measured. The surface reflectance was calculated as an average of the first reflectance and the second reflectance. A value obtained by dividing the first reflectance by the second reflectance was calculated for each of the specimens 50L, 50M, and 50R. The results are shown in FIG. 18B.

As described above, conditions for manufacturing the 1st, 5th, and 9th winding bodies regarding the work roll diameter, the amount of a supplied rolling oil (coolant), and the rolling speed were the same. Conditions for manufacturing the 4th, 8th, and 13th winding bodies regarding the work roll diameter, the amount of a supplied rolling oil (coolant), and the rolling speed were the same. Conditions for manufacturing the 6th, 11th, and 15th winding bodies regarding the work roll diameter, the amount of a supplied rolling oil (coolant), and the rolling speed were the same. As seen from FIGS. 18A and 18B, among the 1st, 5th, and 9th winding bodies, the thinnest 1st winding body exhibits the highest surface reflectance. The same tendency is shown among the 4th, 8th, and 13th winding bodies and among the 6th, 11th, and 15th winding bodies. Hence, it is conceived that a metal plate having a smaller thickness exhibits a higher surface reflectance on condition that the same manufacturing conditions are used.

Examples 25 to 35

The rolling step, the slitting step, and the annealing step described above were performed on the base metal made of an iron alloy containing 36% by mass of nickel, balancing iron, and unavoidable impurities, so that 25th to 35th winding bodies each having the metal plate 64 being 15 μm thick, 18 μm thick, 20 μm thick, 25 μm thick, 30 μm thick, 35 μm thick, 40 μm thick, 50 μm thick, or 100 μm thick wound therearound were manufactured. Conditions for manufacturing the 25th to 35th winding bodies were substantially the same but were different in details.

As in Example 1 above, a first reflectance and a second reflectance of each of the specimens 50L, 50M, and 50R taken from the 25th to 35th winding bodies were measured. The surface reflectance was calculated as an average of the first reflectance and the second reflectance. A value obtained by dividing the first reflectance by the second reflectance (=1st reflectance/2nd reflectance) was calculated for each of the specimens 50L, 50M, and 50R. The results are shown in FIG. 18C.

Next, the deposition mask 20 was manufactured by using the metal plate 64 in the winding body according to each of Examples 1 to 35 described above. The following evaluations were conducted on the resulting deposition masks 20.

Evaluation A: Evaluation of detectability of alignment mark

Evaluation B: Evaluation of accuracy of through-hole area

Evaluation C: Evaluation of variation of through-hole size

Evaluation D: Evaluation of through-hole alignment

For Evaluation A, it was evaluated whether the alignment marks formed on the deposition mask 20 (see FIG. 17A) were detectable. The results are shown in the "Evaluation A" column in FIGS. 18A to 18C. In the "Evaluation A" column, "OK" means that all the alignment marks on the deposition mask 20 were detected, while "NG" means that at least one of the alignment marks was not detected. As an alignment mark detector, an apparatus capable of detecting an alignment mark on the basis of a region that is recognized as black in a taken image of the alignment mark 64*d* as described above was used. The number of alignment marks formed on the deposition mask 20 was 28.

For Evaluation B, it was evaluated whether a deviation of the area of the through-hole 25 in the deposition mask 20 from a reference value was equal to or less than 100 $\mu m^2$. The results are shown in the "Evaluation B" column in FIGS. 18A to 18C. The reference value adopted was a relative value, although the reference value may be an absolute value or a relative value. Specifically, an average of areas of the through-holes 25 around the through-hole 25 under evaluation was adopted as the reference value. In the "Evaluation B" column, "OK" means that a deviation of the area of every through-hole 25 in the deposition mask 20 from the reference value was equal to or less than 100 $\mu m^2$, while "NG" means that a deviation of the area of at least one through-hole 25 from the reference value was greater than 100 $\mu m^2$. The number of through-holes 25 under evaluation was 129 million.

For Evaluation C, it was evaluated whether the variation 2*a* of the size of the first recess 30 in plan view as seen from the first surface 20*a* side of the deposition mask 20 was equal to or less than 2 μm. As an apparatus for measuring the size of the first recess 30, AMIC made by Sinto S-Precision, Ltd. was used. The results are shown in the "Evaluation C" column in FIGS. 18A to 18C. In the "Evaluation C" column, "OK" means that the variation 2*a* of the size of the first recess 30 in the deposition mask 20 was equal to or less than 2 μm, while "NG" means that the variation 2*a* of the size was greater than 2 μm. The number of first recesses 30 under evaluation was 3,150.

For Evaluation D, it was evaluated whether the deposition mask 20 was capable of stretching along the longitudinal direction D1 such that a deviation of the positions of a plurality of the through-holes 25 in the deposition mask 20 from their specified positions along the longitudinal direction D1 and the width direction D2 was equal to or less than 3 μm. The results are shown in the "Evaluation D" column in FIGS. 18A to 18C. In the "Evaluation D" column, "OK" means that the deposition mask 20 was capable of stretching along the longitudinal direction D1 such that a deviation of the positions of a plurality of the through-holes 25 from their specified position was equal to or less than 3 μm, while "NG" means that a deviation of the positions of the through-holes 25 from their specified positions could not be 3 μm or less. The number of through-holes 25 under evaluation was 756.

FIG. 19 shows the measurement and evaluation results of Examples 1 to 24 as listed in FIGS. 18A to 18C sorted by surface reflectance. The "1st reflectance" column in FIG. 19 shows an average of first reflectances of the specimens 50L, 50M, and 50R. The "2nd reflectance" column shows an average of second reflectances of the specimens 50L, 50M, and 50R. The "1st reflectance/2nd reflectance" column shows an average of values of 1st reflectance/2nd reflectance of the specimens 50L, 50M, and 50R.

As shown in FIG. 19, Examples having a surface reflectance of 8.0% or higher were evaluated as OK for Evaluation A while Examples having a surface reflectance less than 8.0% were evaluated as NG for Evaluation A. Thus, the above-mentioned judgment condition A is regarded as a useful judgment condition concerning detectability of an alignment mark.

As shown in FIG. 19, Examples having a surface reflectance of 25% or lower were evaluated as OK for Evaluation B while Example having a surface reflectance higher than 25% were evaluated as NG for Evaluation B. Thus, the above-mentioned judgment condition B is regarded as a useful judgment condition concerning accuracy of a through-hole area, that is, adhesion of a resist film.

As shown in FIG. 19, Examples having a surface reflectance of 20% or lower were evaluated as OK for Evaluation C while Example having a surface reflectance higher than 20% were evaluated as NG for Evaluation C. Thus, the above-mentioned judgment condition C is regarded as a further useful judgment condition concerning variation of the size of a through-hole, that is, adhesion of a resist film.

As shown in FIG. 19, Examples having a first reflectance/second reflectance value of 0.70 to 1.30 were evaluated as OK for Evaluation D. By contrast, Examples having a first reflectance/second reflectance value less than 0.70 or greater than 1.30 were evaluated as NG for Evaluation D. Thus, the above-mentioned judgment condition D is regarded as a useful judgment condition concerning easiness of the step of aligning the through-holes 25.

In the "Overall evaluation" column in FIGS. 18A to 18C and 19, "great" means that the Example was evaluated as OK for all of Evaluations A, B, C, and D. In the same column, "good" means that the Example was evaluated as OK for Evaluations A, B, and D but evaluated as NG for Evaluation C. In the same column, "not good" means that the Example was evaluated as NG for at least one of Evaluations A, B, and D.

The invention claimed is:

1. A metal plate used for manufacturing a deposition mask, the metal plate comprising:

a surface including a longitudinal direction of the metal plate and a width direction orthogonal to the longitudinal direction, wherein a surface reflectance by regular reflection of a light is 8% or more and 25% or less, the surface reflectance being measured when the light is incident on the surface at an incident angle of 45°±0.2°, the light being in at least one plane orthogonal to the surface.

2. The metal plate according to claim 1, wherein the surface reflectance is 8% or more and 20% or less.

3. The metal plate according to claim 1, wherein an average of a first reflectance and a second reflectance is 8% or more and 25% or less, wherein the first reflectance is a surface reflectance by regular reflection of a light, the first reflectance being measured when the light is incident on the surface at an incident angle of 45°±0.2°, the light being in a first plane orthogonal to the surface and to the longitudinal direction, and wherein the second reflectance is a surface reflectance by regular reflection of a light, the second reflectance being measured when the light is incident on the surface at an incident angle of 45°±0.2°, the light being in a second plane orthogonal to the surface and to the width direction.

4. The metal plate according to claim 3, wherein an average of the first reflectance and the second reflectance is 8% or more and 20% or less.

5. The metal plate according to claim 3, wherein the metal plate comprises a first area, a second area, and a third area arranged from one end to the other end of the metal plate with respect to the width direction, the first area, the second area, and the third area each having the same length along the width direction, and wherein each of the first reflectance and the second reflectance is an average of the reflectances measured within the first area, the second area, and the third area.

6. The metal plate according to claim 3, wherein a value obtained by dividing the first reflectance by the second reflectance is 0.70 or more and 1.30 or less.

7. The metal plate according to claim 3, wherein the average surface reflectance is 24.5% or less.

8. The metal plate according to claim 1, wherein a thickness of the metal plate is equal to or less than 100 μm.

9. The metal plate according to claim 1, wherein the metal plate is made of an iron alloy containing nickel.

10. The metal plate according to claim 1, wherein the surface of the metal plate includes a plurality of rolling streaks extending in the longitudinal direction, or the surface of the metal plate includes a plurality of oil pits having a direction orthogonal to the longitudinal direction.

11. The metal plate according to claim 1, wherein the metal plate is for manufacturing the deposition mask which is obtained by exposing and developing a resist film attached to the surface of the metal plate to form a first resist pattern, and etching a region of the surface of the metal plate, the region being not covered with the first resist pattern.

12. The metal plate according to claim 11, wherein the metal plate is for manufacturing the deposition mask which is obtained by exposing and developing a resist film attached to the surface of the metal plate under an environment at equal to or less than 1,000 Pa to form a first resist pattern, and etching a region of the surface of the metal plate, the region being not covered with the first resist pattern.

13. The metal plate according to claim 1, wherein the surface reflectance is calculated as a percentage relative to an intensity measured when the light is directly entered a detector.

14. The metal plate according to claim 1, wherein the surface reflectance is a first surface reflectance that is based on a reflected light observed when the light is incident on a first surface of the metal plate, the first surface constituting a surface of the deposition mask on an organic EL substrate's side.

15. The metal plate according to claim 1, wherein the surface reflectance is 8% or more and 24.8% or less.

16. A method for manufacturing a metal plate used for manufacturing a deposition mask, the method comprising:

a production step of obtaining the metal plate by a rolling process or a plating process, wherein the metal plate comprises a surface including a longitudinal direction of the metal plate and a width direction orthogonal to the longitudinal direction, and wherein a surface reflectance of a reflected light observed when a light is incident on the surface of the metal plate is 8% or more and 25% or less, the surface reflectance being measured based on the reflected light on the surface at an angle of 45°±0.2° in at least one plane orthogonal to the surface.

17. The method for manufacturing a metal plate according to claim 16, the method comprising:

a screening step of sorting out the metal plate that has the surface reflectance 8% or more and 25% or less.

18. A deposition mask comprising:

a metal plate; and a plurality of through-holes formed in the metal plate, wherein a surface reflectance of a reflected light observed when a light is incident on a surface of the metal plate is 8% or more and 25% or less, the surface reflectance being measured based on the reflected light on the surface at an angle of 45°±0.2° in at least one plane orthogonal to the surface.

19. A method for manufacturing a deposition mask comprising a plurality of through-holes formed in the deposition mask, the method comprising:

a step of preparing a metal plate;

a resist film forming step of disposing a resist film on a surface of the metal plate;

a step of processing the resist film to form a resist pattern; and a step of etching the metal plate with the resist pattern serving as a mask, wherein a surface reflectance of a reflected light observed when a light is incident on a surface of the metal plate is 8% or more and 25% or less, the surface reflectance being measured based on the reflected light on the surface at an angle of 45°±0.2° in at least one plane orthogonal to the surface.

20. The method for manufacturing a deposition mask according to claim 19, wherein the resist film forming step includes a step of attaching the resist film to the surface of the metal plate under an environment at equal to or less than 1,000 Pa.

* * * * *